(12) United States Patent
Yamanaka et al.

(10) Patent No.: US 10,407,579 B2
(45) Date of Patent: Sep. 10, 2019

(54) INFRARED-LIGHT-TRANSMITTING INK OF DARK COLOR, AND INFRARED-LIGHT-REFLECTING SHEET OBTAINED USING SAME

(71) Applicant: Dai Nippon Printing Co., Ltd., Tokyo (JP)

(72) Inventors: Naoto Yamanaka, Tokyo (JP); Hitoshi Nishikawa, Tokyo (JP); Keita Arihara, Tokyo (JP)

(73) Assignee: Dai Nippon Printing Co., Ltd., Tokyo (JP)

( * ) Notice: Subject to any disclaimer, the term of this patent is extended or adjusted under 35 U.S.C. 154(b) by 26 days.

(21) Appl. No.: 15/515,880

(22) PCT Filed: Sep. 30, 2015

(86) PCT No.: PCT/JP2015/077789
§ 371 (c)(1),
(2) Date: Mar. 30, 2017

(87) PCT Pub. No.: WO2016/052641
PCT Pub. Date: Apr. 7, 2016

(65) Prior Publication Data
US 2017/0298239 A1    Oct. 19, 2017

(30) Foreign Application Priority Data

Sep. 30, 2014  (JP) ................................ 2014-202550
Sep. 30, 2014  (JP) ................................ 2014-202661

(51) Int. Cl.
*C09D 11/037*   (2014.01)
*C09D 11/101*   (2014.01)
(Continued)

(52) U.S. Cl.
CPC .............. *C09D 11/037* (2013.01); *B32B 7/02* (2013.01); *B32B 27/00* (2013.01); *B32B 27/20* (2013.01);
(Continued)

(58) Field of Classification Search
None
See application file for complete search history.

(56) References Cited

U.S. PATENT DOCUMENTS

2003/0030041 A1*  2/2003  Genjima ................. B32B 27/20
                                                                  252/587
2012/0009416 A1*  1/2012  Lai ......................... C09D 5/004
                                                                  428/323
(Continued)

FOREIGN PATENT DOCUMENTS

EP      2860764 A1     4/2015
JP      2001-044474 A  2/2001
(Continued)

OTHER PUBLICATIONS

Pigment Brown 25, National Center for Biotechnology Information, PubChem Compound Database, CID=9575952, https://pubchem.ncbi.nlm.nih.gov/compound/9575953, no date available; 14 pages.*
(Continued)

*Primary Examiner* — Helene Klemanski
(74) *Attorney, Agent, or Firm* — Locke Lord LLP; James E. Armstrong, IV; Nicholas J. DiCeglie, Jr.

(57) ABSTRACT

In order to satisfy the demand of consumers regarding design attractiveness, an infrared-light-transmitting dark color ink is provided, the ink having a black appearance and attaining high design attractiveness and, despite this, having sufficient infrared-light-transmitting property. The infrared-light-transmitting dark color ink transmits near infrared light having wavelengths of 750-1,500 nm, and comprises a resin
(Continued)

component and a pigment component that comprises both a brown pigment, e.g., a benzimidazolone pigment, and a phthalocyanine pigment.

17 Claims, 7 Drawing Sheets

(51) Int. Cl.
- *C09D 11/322* (2014.01)
- *C09D 5/00* (2006.01)
- *B32B 7/02* (2019.01)
- *B32B 27/20* (2006.01)
- *C09D 7/40* (2018.01)
- *B32B 27/00* (2006.01)
- *C09D 175/04* (2006.01)
- *H01L 31/049* (2014.01)
- *B41M 7/00* (2006.01)
- *C09B 56/14* (2006.01)
- *C09D 5/33* (2006.01)
- *C09D 11/328* (2014.01)

(52) U.S. Cl.
CPC .............. *B41M 7/009* (2013.01); *C09B 56/14* (2013.01); *C09D 5/004* (2013.01); *C09D 7/40* (2018.01); *C09D 11/101* (2013.01); *C09D 11/322* (2013.01); *C09D 11/328* (2013.01); *C09D 175/04* (2013.01); *H01L 31/049* (2014.12)

(56) References Cited

U.S. PATENT DOCUMENTS

| | | | |
|---|---|---|---|
| 2014/0335329 A1* | 11/2014 | Abayasinghe | C09D 5/004 428/212 |
| 2015/0307688 A1* | 10/2015 | Kitao | C09D 5/00 524/88 |
| 2015/0376412 A1 | 12/2015 | Harada et al. | |

FOREIGN PATENT DOCUMENTS

| | | |
|---|---|---|
| JP | 2012216689 A | 11/2012 |
| JP | 2014156501 A | 8/2014 |
| WO | 2013183658 A1 | 12/2013 |
| WO | 2014/067613 A2 | 5/2014 |
| WO | 2016/043335 A1 | 3/2016 |
| WO | 2016/104413 A1 | 6/2016 |

OTHER PUBLICATIONS

Extended European Search Report dated Feb. 16, 2018, issued to EP Patent Application No. 15847770.3.
Notification of Reasons for Refusal issued in corresponding Japanese Patent Application No. JP 2019-033048, dated Mar. 19, 2019.
Decision of Refusal issued in correspoding Japanese Patent Application No. JP 2019-033048, dated May 14, 2019.

* cited by examiner

INFRARED-LIGHT-TRANSMITTING INK OF DARK COLOR, AND INFRARED-LIGHT-REFLECTING SHEET OBTAINED USING SAME

TECHNICAL FIELD

The present invention relates to an infrared-light-transmitting dark color ink. More specifically, the present invention relates to an infrared-light-transmitting dark color ink mainly used in an infrared-light-reflecting sheet for a solar cell module, or the like.

BACKGROUND ART

In recent years, solar cells have been receiving attention as a clean energy source due to the rise in awareness of environmental problems. In general, a solar cell module constituting a solar cell has a configuration in which a transparent front substrate, a sealing material, a solar cell element, a sealing material, and a rear surface protective sheet are laminated sequentially from the photoreception surface side, and has a function of generating electric power by sunlight being incident on the solar cell element.

For example, regarding inks used in solar cell modules and the like, from the viewpoint of design attractiveness, inks the appearance of which is colored with black are required in some cases. As a method of coloring appearance with a dark color, a method of providing an ink containing carbon black is mentioned. However, carbon black absorbs near infrared light to cause an increase in temperature, and thus it cannot be said that, when the ink containing carbon black is used, for example, in solar cell modules and the like, the ink containing carbon black is necessarily preferable.

When the ink containing carbon black is used in a rear surface protective sheet for a solar cell module, the temperature of the solar cell module is increased at the time of using the solar cell module. As a result, the electric power generation efficiency of the solar cell module is decreased.

In this regard, a rear surface protective sheet for a solar cell module has been developed which includes a black resin layer containing an organic pigment such as an oxazine pigment having an infrared-light-transmitting property, a white resin layer having infrared reflectivity, a rear surface protective layer having weather resistance, and the like in order to suppress heat generation in a dark color layer and to cause reflective light to be incident to a solar cell element so that electric power generation efficiency is improved and which is produced by attaching this plurality of layers to each other with an adhesive or the like.
(Patent Document 1).

An infrared-light-transmitting dark color ink containing an oxazine pigment and a curing agent becomes an infrared-light-transmitting dark color ink having high durability of adhesion. (Patent Document 1 [0057]). However, the oxazine pigment transmits light having a wavelength of 700 to 800 nm, and thus the oxazine pigment itself is a pigment having a color close to violet rather than black. For this reason, the infrared-light-transmitting dark color ink in which the oxazine pigment is included in a resin has a color close to violet. Therefore, it cannot be said that the infrared-light-transmitting dark color ink in which the oxazine pigment is included in a resin is necessarily preferable when a black appearance is required from the viewpoint of design attractiveness.

In particular, when the infrared-light-transmitting dark color ink is used in the rear surface protective sheet of the solar cell module, the demand for the electric power generation efficiency of the solar cell module becomes even stronger. The infrared-light-transmitting dark color ink used in the rear surface protective sheet is required to be an infrared-light-transmitting dark color ink which further transmits infrared light. The infrared-light-transmitting dark color ink which transmits infrared light can suppress increases in temperature of the solar cell module by suppressing absorption of near infrared light. In addition, by utilizing infrared light in electric power generation, the electric power generation efficiency of the solar cell module can be further enhanced. Therefore, it is important to use the infrared-light-transmitting dark color ink which further transmits infrared light.

Patent. Document 1: Japanese Unexamined Patent Application, Publication. No, 2012-216689

DISCLOSURE OF THE INVENTION

Problems to be Solved by the Invention

An object of the present invention is to provide an excellent infrared-light-transmitting dark color ink which is an ink capable of providing a dark color appearance to a rear surface protective sheet for a solar cell module and has a high near infrared transmission rate.

Means for Solving the Problems

The present inventors have conducted intensive studies in order to solve the above-described problems. As a result, they have found that the above-described problems can be solved with an infrared-light-transmitting dark color ink which contains a pigment component containing a predetermined brown pigment and a phthalocyanine pigment, and thus have completed the present invention. More specifically, the present invention provides the following.

(1) An infrared-light-transmitting dark color ink which transmits near infrared light having a wavelength of 750 nm to 1500 nm, the infrared-light-transmitting dark color ink containing: a resin component and a pigment component, in which the pigment component contains a brown pigment and a dark color pigment composed of a phthalocyanine pigment, and the brown pigment is at least one or more pigments selected from the group consisting of a benzimidazolone pigment, 4-[(2,5-dichlorophenyl)azo]-3-hydroxy-N-(2,5-dimethoxyphenyl)-2-naphthalenecarboxamide, 1-[(4-nitrophenyl)azo]-2-naphthalenol, bis[3-hydroxy-4-(phenylazo)-2-naphthalenecarboxylic acid]copper salt, C. I. Pigment Brown 7, N,N'-bis(2,4-dinitrophenyl)-3,3'-dimethoxy-1,1'-biphenyl-4,4'-diamine, 3,4,9,10-perylenetetracarboxylic diimide, Δ2,2'(1H,1'H)-binaphtho[2,1-b]thiophen-1,1'-dione, and N,N'-(10,15,16,17-tetrahydro-5,10,15,17-tetraoxo)-5H-dinaphtho[2,3-a:2',3'-i]carbazole-4,9-diyl)bis(benzamide).

(2) The infrared-light-transmitting dark color ink described in (1), in which a content of the dark color pigment in the pigment component is 80% by mass or more, and a transmission rate of light having a wavelength of 425 nm of the infrared-light-transmitting dark color ink in a light transmission rate test is 5% to 30%, and a transmission rate of light having a wavelength of 675 nm is 4% to 20%.

(3) The infrared-light-transmitting dark color ink described in (1) or (2), in which a content of the pigment component is 20 parts by mass to 40 parts by mass with respect to 100 parts by mass of the resin component.

(4) An infrared-light-reflecting sheet including an infrared-light-transmitting dark color layer laminated on a surface of a reflective layer reflecting near infrared light having a wavelength of 750 nm to 1500 nm, in which the infrared-light-transmitting dark color layer contains a main agent resin having a hydroxyl group, a curing agent having an isocyanate group, and a pigment component, the pigment component contains a brown pigment and a dark color pigment composed of a phthalocyanine pigment, and the brown pigment is at least one or more pigments selected from the group consisting of a benzimidazolone pigment, 4-[(2,5-dichlorophenyl)azo]-3-hydroxy-N-(2,5-dimethoxyphenyl)-2-naphthalenecarboxamide, 1-[(4-nitrophenyl)azo]-2-naphthalenol, bis[3-hydroxy-4-(phenylazo)-2-naphthalenecarboxylic acid]copper salt, C. I. Pigment Brown 7, N,N'-bis(2,4-dinitrophenyl)-3,3'-dimethoxy-1,1'-biphenyl-4,4'-diamine, 3,4,9,10-perylenetetracarboxylic diimide, Δ2,2'(1H,1'H)-binaphtho[2,1-b]thiophen-1,1'-dione, and N,N'-(10,15,16,17-tetrahydro-5,10,15,17-tetraoxo)-5H-dinaphtho[2,3-a:2',3'-i]carbazole-4,9-diyl)bis(benzamide).

(5) The infrared-light-reflecting sheet described in (4), further including a transparent easy-adhesive layer laminated on the surface on the lamination side of the infrared-light-transmitting dark color layer of the infrared-light-reflecting sheet.

(6) An infrared-light-reflecting sheet including an infrared-light-transmitting dark color layer and a transparent resin layer sequentially laminated on a surface of a reflective layer reflecting near infrared light having a wavelength of 750 nm to 1500 nm, in which the infrared-light-transmitting dark color layer contains a main agent resin having a hydroxyl group, a curing agent having an isocyanate group, and a pigment component, a content of the pigment component is 20 parts by mass to 40 parts by mass with respect to 100 parts by mass of a resin component, the pigment component contains a brown pigment and a dark color pigment composed of a phthalocyanine pigment, and the brown pigment is at least one or more pigments selected from the group consisting of a benzimidazolone pigment, 4-[(2,5-dichlorophenyl)azo]-3-hydroxy-N-(2,5-dimethoxyphenyl)-2-naphthalenecarboxamide, 1-[(4-nitrophenyl)azo]-2-naphthalenol, bis[3-hydroxy-4-(phenylazo)-2-naphthalenecarboxylic acid]copper salt, C. I. Pigment Brown 7, N,N'-bis(2,4-dinitrophenyl)-3,3'-dimethoxy-1,1'-biphenyl-4,4'-diamine, 3,4,9,10-perylenetetracarboxylic diimide, Δ2,2'(1H,1'H)-binaphtho[2,1-b]thiophen-1,1'-dione, and N,N'-(10,15,16,17-tetrahydro-5,10,15,17-tetraoxo)-5H-dinaphtho[2,3-a:2',3'-i]carbazole-4,9-diyl)bis(benzamide).

(7) The infrared-light-reflecting sheet described in (6), in which a coating amount of an infrared-light-transmitting dark color ink forming the infrared-light-transmitting dark color layer in terms of solid content is 5 g/m² to 15 g/m².

(8) The infrared-light-reflecting sheet described in any one of (4) to (7), in which a color difference ΔE*ab between a color tone of the infrared-light-transmitting dark color layer 60 and a color tone of carbon black as measured under conditions of a D65 light source and a 10° view angle according to JIS-Z 8722 is 10 or less.

(9) An infrared-light-reflecting sheet which is a rear surface protective sheet for a solar cell module, the infrared-light-reflecting sheet being obtained by laminating a plurality of layers, the plurality of layers including at least: a transparent adhesion layer transmitting all light beams; and a reflective layer reflecting near infrared light having a wavelength of 750 nm to 1500 nm, in which two layers among layers laminated between the transparent adhesion layer and the reflective layer are an infrared-light-transmitting dark color layer and a transparent adhesive layer, the infrared-light-transmitting dark color layer contains a main agent resin having a hydroxyl group, a curing agent, having an isocyanate group, and a pigment component, a content of the pigment component contained in the infrared-light-transmitting dark color layer is 20 parts by mass to 50 parts by mass with respect to 100 parts by mass of the main agent resin, the pigment component contains a brown pigment and a dark color pigment composed of a phthalocyanine pigment, the brown pigment is at least one or more pigments selected from the group consisting of a benzimidazolone pigment, 4-[(2,5-dichlorophenyl)azo]-3-hydroxy-N-(2,5-dimethoxyphenyl)-2-naphthalenecarboxamide, 1-[(4-nitrophenyl)azo]-2-naphthalenol, bis[3-hydroxy-4-(phenylazo)-2-naphthalenecarboxylic acid]copper salt, C. I. Pigment Brown 7, N,N'-bis(2,4-dinitrophenyl)-3,3'-dimethoxy-1,1'-biphenyl-4,4'-diamine, 3,4,9,10-perylenetetracarboxylic diimide, Δ2,2'(1H,1'H)-binaphtho[2,1-b]thiophen-1,1'-dione, and N,N'-(10,15,16,17-tetrahydro-5,10,15,17-tetraoxo)-5H-dinaphtho[2,3-a:2',3'-i]carbazole-4,9-diyl)bis(benzamide), and an NCO/OH ratio that is a ratio of an NCO value of the curing agent to an OH value of the main agent resin is 1.0 to 2.0.

(10) The infrared-light-reflecting sheet described in (9), in which a coating amount of an infrared-light-transmitting dark color ink forming the infrared-light-transmitting dark color layer in terms of solid content is 3 g/m² to 7 g/m².

(11) The infrared-light-reflecting sheet described in (9) or (10), in which the curing agent having an isocyanate group is a diisocyanate compound.

(12) The infrared-light-reflecting sheet described in any one of (9) to (11), in which the infrared-light-transmitting dark color layer is laminated only on a part of the surface of the transparent adhesion layer and/or the reflective layer.

(13) The infrared-light-reflecting sheet described in any one of (4) to (12), in which an infrared-light-transmitting coat layer containing an organic dark color pigment is laminated on a surface opposite to the lamination surface of the infrared-light-transmitting dark color layer of the reflective layer, and the infrared.-light-transmitting coat layer transmits near infrared light having a wavelength of 750 nm to 1500 nm.

(14) A solar cell module including the infrared-light-reflecting sheet described in any one of (4) to (13) laminated on a non-photoreception surface side of a solar cell element.

EFFECTS OF THE INVENTION

The infrared-light-transmitting dark color ink of the present invention can suppress heat generation caused by absorption of near infrared light even in an environment in which sunlight is radiated. The infrared-light-reflecting sheet of the present invention obtained by using the infrared-light-transmitting dark color ink in the infrared-light-reflecting sheet (rear surface protective sheet) for a solar cell module sufficiently satisfies design attractiveness. Further, when the infrared-light-reflecting sheet suppresses heat generation caused by absorption of near infrared light and is used as the rear surface protective sheet for the solar cell module, the infrared-light-reflecting sheet can also contribute to an increase in the electric power generation efficiency of the solar cell module. Therefore, when the infrared-light-transmitting dark color ink of the present invention is used as the rear surface protective sheet for the solar cell module, this rear surface protective sheet is an excellent rear surface protective sheet.

PREFERRED MODE FOR CARRYING OUT THE INVENTION

Hereinafter, an infrared-light-transmitting dark color ink of the present invention will be described in detail. The present invention is not limited to the embodiments described below.

<Infrared-Light-Transmitting Dark Color Ink>

An infrared-light-transmitting dark color ink of the present invention can be used for coloring an rear surface protective sheet for a solar cell module, or the like with a dark color from the viewpoint of design attractiveness. The infrared-light-transmitting dark color ink has a high near infrared light transmission rate. For this reason, heat generation caused by the absorption of near infrared light can be suppressed. For example, when an infrared-light-transmitting dark color layer 60 is formed by the infrared-light-transmitting dark color ink of the present invention on a surface of a reflective sheet which can reflect near infrared light, an infrared-light-reflecting sheet which can reflect near infrared light while the appearance thereof is darkly colored can be produced.

When the infrared-light-transmitting dark color ink of the present invention contains a curing agent, the infrared-light-transmitting dark color ink becomes an infrared-light-transmitting dark color ink capable of attaching sheets to each other. For example, the infrared-light-transmitting dark color layer can be formed by applying the infrared-light-transmitting dark color ink containing a curing agent onto a sheet, laminating another sheet thereto, and by curing the infrared-light-transmitting dark color ink.

An infrared-light-reflecting sheet 6 may be formed by sequentially laminating the infrared-light-transmitting dark color layer 60 and a transparent adhesion layer 62 on a surface of a reflective layer 61 reflecting near infrared light. For example, the infrared-light-reflecting sheet 6 of the present invention can also be used as a rear surface protective sheet for a solar cell module by disposing the infrared-light-reflecting sheet 6 on a non-photoreception surface side of the solar cell element.

Figure 6:
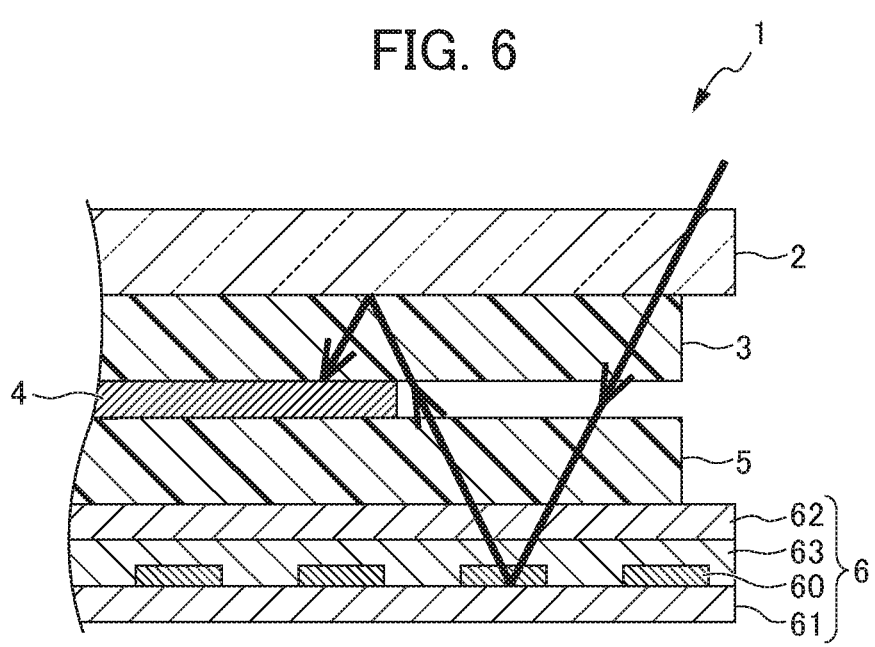
FIG. 6 is a diagram provided to describe a layer structure of an infrared-light-reflecting sheet of another embodiment and is an enlarged sectional schematic view in a state where the infrared-light-reflecting sheet is integrated with the solar cell module when the infrared-light-reflecting sheet is used as a rear surface protective sheet for the solar cell module.

From the viewpoint of design attractiveness, there is a case where the entire surface of the infrared-light-reflecting sheet 6 is not darkly colored, but a partially colored infrared-light-reflecting sheet 6 is required, for example, for providing a design such as patterning. When the infrared-light-reflecting sheet 6 of the embodiment of FIG. 6 is used as the rear surface protective sheet for the solar cell module, the rear surface protective sheet becomes an excellent rear surface protective sheet for a solar cell module which is excellent in design attractiveness and can maintain electric power generation efficiency as high as that of the related art. The infrared-light-reflecting sheet 6 of the embodiment of FIG. 6 will be described later.

Figure 2:
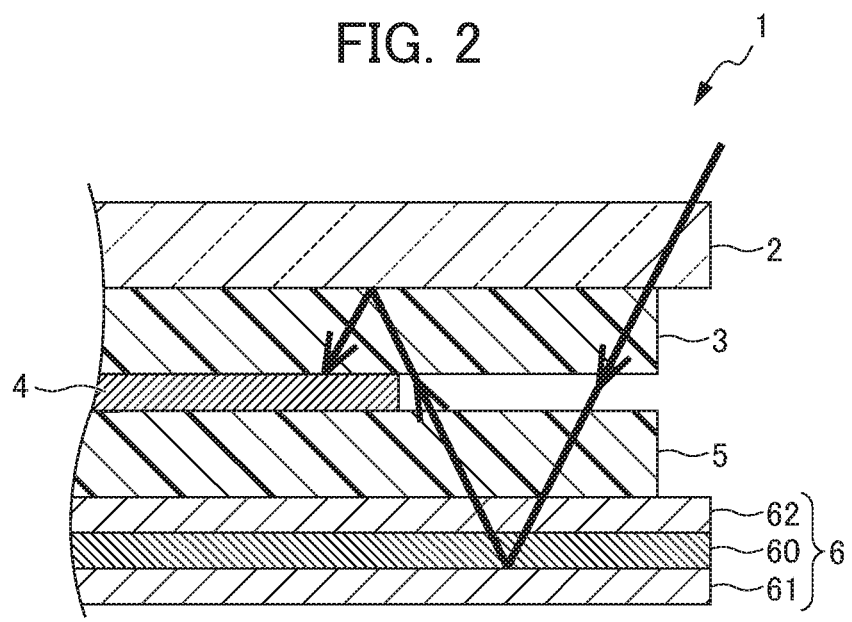
FIG. 2 is a diagram provided to describe a layer structure of an infrared-light-reflecting sheet and is an enlarged sectional schematic view in a state where the infrared-light-reflecting sheet is integrated with the solar cell module when the infrared-light-reflecting sheet is used as a rear surface protective sheet for the solar cell module.

As illustrated in FIG. 2 or 6, the infrared-light-reflecting sheet can be formed by curing the infrared-light-transmitting dark color ink, which is applied to the upper surface of the reflective layer 61 or the lower surface of the transparent adhesion layer 62 facing the upper surface, after lamination. When the infrared-light-transmitting dark color layer 60 is formed at a position between the reflective layer 61 and the transparent adhesion layer 62, the infrared-light-reflecting sheet 6 can be configured as a favorable sheet in terms of design attractiveness.

It is important for the infrared-light-transmitting dark color ink forming the infrared-light-transmitting dark color layer 60 that the appearance thereof is black or has a dark color close to black, that is, the infrared-light-transmitting dark color ink has properties of absorbing visible light and transmitting near infrared light.

Herein, near infrared light is a range nearest a visible range among infrared ranges, but regarding specific wavelength ranges of near infrared light, values thereof are various depending on the literature. The near infrared light described in the present invention indicates an electromagnetic wave having a wavelength range of 750 nm to 2200 nm. Among them, particularly, a wavelength promoting heat accumulation is 1000 nm to 1500 nm.

For the infrared-light-transmitting dark color ink forming the infrared-light-transmitting dark color layer 60, an infrared-light-transmitting dark color ink having a property of transmitting a light beam having a wavelength of 750 nm to 1500 nm in a cured state is used. Incidentally, the expression "transmitting a light beam having a wavelength of 750 nm to 1500 nm" means transmitting 15% or more of the light beam having a wavelength of 750 nm to 1500 nm in the infrared-light-transmitting dark color layer 60, preferably means transmitting 50% or more of the light beam, and more preferably means transmitting 60% or more of the light beam.

The infrared-light-transmitting dark color ink used in the infrared-light-transmitting dark color layer 60 can be used for attaching sheets to each other. When the infrared-light-transmitting dark color ink is used in this way, the infrared-light-transmitting dark color ink is preferably a two-component type including a main agent and a curing agent. From the viewpoint of coating property and handling property, a solvent is suitably contained as a composition.

[Organic Pigment]

A pigment component contained in the infrared-light-transmitting dark color ink of the present invention contains a dark color pigment composed of a brown pigment and a phthalocyanine pigment. The brown pigment will be hereinafter described in detail. The infrared-light-transmitting dark color ink of the present invention which contains a pigment component containing such a dark color pigment is an excellent ink that has dark color appearance and a high infrared light transmission rate.

In the present specification, the brown pigment is at least one or more pigments selected from the group consisting of a benzimidazolone pigment, 4-[(2,5-dichlorophenyl)azo]-3-hydroxy-N-(2,5-dimethoxyphenyl)-2-naphthalenecarboxamide, 1-[(4-nitrophenyl)azo]-2-naphthalenol, bis[3-hydroxy-4-(phenylazo)-2-naphthalenecarboxylic acid]copper salt, N,N'-bis(2,4-dinitrophenyl)-3,3'-dimethoxy-1,1'-biphenyl-4,4'-diamine, 3,4,9,10-perylenetetracarboxylic diimide, Δ2,2'(1H,1'H)-binaphtho[2,1-b]thiophen-1,1'-dione, and N,N'-(10,15,16,17-tetrahydro-5,10,15,17-tetraoxo-5H-dinaphtho[2,3-a:2',3'-i]carbazole-4,9-diyl)bis(benzamide).

The brown pigment is preferably a benzimidazolone pigment from the viewpoint of dispersibility of the pigment in the adhesive layer and adhesiveness of the adhesive layer, and the like. The benzimidazolone pigment is a pigment having a benzimidazolone skeleton represented by the following General Formula (1). Specific examples thereof include C. I. Pigment Yellow 120, C. I. Pigment Yellow 151, C. I. Pigment Yellow 154, C. I. Pigment Yellow 175, C. I. Pigment Yellow 180, C. I. Pigment Yellow 181, C. I. Pigment Yellow 194, C. I. Pigment Red 175, C. I. Pigment Red 176, C. I. Pigment Red 185, C. I. Pigment Red 208, C. I. Pigment Violet 32, C. I. Pigment Orange 36, C. I. Pigment Orange 62, C. I. Pigment Orange 72, and C. I. Pigment Brown 25, but the benzimidazolone pigment is not limited thereto. From the viewpoint of color gamut, C. I. Pigment Brown 25 is more preferable.

[Chem. 1]

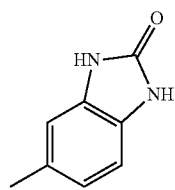

(1)

The primary particle diameter of the benzimidazolone pigment is preferably 0.01 μm to 0.20 μm. When the primary particle diameter of the benzimidazolone pigment is set in such a range, dispersibility of the pigment in the ink can be improved.

Brown pigments other than the benzimidazolone pigment will be described. Specific examples of 4-[(2,5-dichlorophenyl)azo]-3-hydroxy-N-(2,5-dimethoxyphenyl)-2-naphthalenecarboxamide include C. I. Pigment Brown 1. Specific examples of 1-[(4-nitrophenyl)azo]-2-naphthalenol include C. I. Pigment Brown 2. Specific examples of bis[3-hydroxy-4-(phenylazo)-2-naphthalenecarboxylic acid]copper salt include C. I. Pigment Brown 5. Specific examples of N,N'-bis(2,4-dinitrophenyl)-3,3'-dimethoxy-1,1'-biphenyl-4,4'-diamine include C. I. Pigment Brown 22. Specific examples of 3,4,9,10-perylenetetracarboxylic diimide include C. I. Pigment Brown. 26. Specific examples of Δ2,2'(1H,1'H)-binaphtho[2,1-b]thiophen-1,1'-dione include C. I. Pigment Brown 27. Specific examples of N,N'-(10,15,16,17-tetrahydro-5,10,15,17-tetraoxo-5H-dinaphtho[2,3-a:2',3'-i]carbazole-4,9-diyl)bis(benzamide) include C. I. Pigment Brown 28. In addition to the above-described brown pigments, C. I. Pigment Brown 7 may be used as the brown pigment.

The phthalocyanine pigment is a pigment having a phthalocyanine skeleton and is a concept including phthalocyanine in which various metals are coordinated. Specific examples thereof include C. I. Pigment Green 7, C. I. Pigment Green 36, C. I. Pigment Green 37, C. I. Pigment Blue 16, C. I. Pigment Blue 75, and C. I. Pigment Blue 15, but the phthalocyanine pigment is not limited thereto. A phthalocyanine pigment that is amorphous and blue is preferably used.

The primary particle diameter of the phthalocyanine pigment is preferably 0.15 μm to 0.20 μm. When the primary particle diameter is set in such a range, dispersibility of the phthalocyanine pigment in the ink can be improved.

The content of the brown pigment in the infrared-light-transmitting dark color ink is preferably set to 43 parts by mass to 233 parts by mass with respect to 100 parts by mass of the phthalocyanine pigment (the content ratio of the brown pigment and the phthalocyanine pigment is in a range of 30:70 to 70:30 in terms of mass ratio), and more preferably 66 parts by mass to 150 parts by mass (the content ratio of the brown pigment and the phthalocyanine pigment is in a range of 40:60 to 60:40 in terms of mass ratio). When the content ratio is in such a range, the infrared-light-transmitting dark color ink can be configured as a favorable ink in terms of design attractiveness and infrared-light-transmitting property.

The content of the brown pigment in the infrared-light-transmitting dark color ink can be specified by a transmission rate of light having a specific wavelength in the light transmission rate test. In order to adjust the content of the brown pigment such as a benzimidazolone pigment and the content of the phthalocyanine pigment to be preferable in terms of design attractiveness and infrared-light-transmitting property, it is preferable that the brown pigment such as a benzimidazolone pigment and the phthalocyanine pigment contained in the infrared-light-transmitting dark color ink are 80% by mass or more of the total amount of the pigment component, a transmission rate of light having a wavelength of 425 nm of the infrared-light-transmitting dark color ink in the light transmission rate test is 5% to 30%, and a transmission rate of light having a wavelength of 675 nm is 4% to 20%. The phthalocyanine pigment has properties of transmitting a certain quantity of light having a wavelength of 425 nm and not transmitting light having a wavelength of 675 nm. The brown pigment such as a benzimidazolone pigment has properties of transmitting a certain quantity of light having a wavelength of 675 nm and not transmitting light having a wavelength of 425 nm. Therefore, by specifying the transmission rate of light having a wavelength of 425 nm and the transmission rate of light having a wavelength of 675 nm in the light transmission rate test, the content ratio of the content of the brown pigment such as a benzimidazolone pigment and the content or the phthalocyanine pigment can be specified.

Incidentally, as a method for measuring the transmission rate of the infrared-light-transmitting dark color ink, the transmission rate can be measured, for example, with the following method.

5 g/m² of the infrared-light-transmitting dark color ink containing a curing agent is gravure coated on white PET (188 μm), polyethylene (60 μm) is laminated thereon, and the obtained product is subjected to thermal curing by performing an aging treatment at 45° C. to 55° C. for 168 hours, thereby producing an infrared-light-reflecting sheet. Then, a transmission rate measurement sample of a solution obtained by peeling off polyethylene and the white PET of the infrared-light-reflecting sheet and dissolving the infrared-light-transmitting dark color layer (infrared-light-transmitting dark color ink) by using methyl ethyl ketone is produced (for example, the pigment concentration of the measurement sample is about 0.01 g to 0.5 g of the pigment with respect to 100 g of methyl ethyl ketone). The content of the brown pigment in the infrared-light-transmitting dark color ink can be estimated by injecting the measurement sample into a quartz glass cell, measuring a transmission rate (%) of light having a wavelength of 300 nm to 1200 nm with a spectrophotometer (for example, an ultraviolet spectrophotometer "V-670" manufactured by JASCO Corporation or "U-4100" manufactured by Hitachi High-Technologies Corporation), and then obtaining a transmission rate of light having a wavelength of 425 nm and of light having a wavelength of 675 nm.

As a method for measuring the transmission rate of the infrared-light-transmitting dark color layer formed by the infrared-light-transmitting dark color ink, the transmission rate can be measured with the following method. 5 g/m² of the infrared-light-transmitting dark color ink containing a curing agent is gravure coated on a fluorine film (100 μm) serving as a transparent base material, the same fluorine film (100 μm) is laminated thereon, and the obtained product is subjected to dry lamination and then subjected to thermal curing by performing an aging treatment at 45° C. to 55° C. for 168 hours, thereby producing a transmission rate measurement sample. Measurement can be carried out by injecting the measurement sample into a quartz glass cell, measuring a transmission rate (%) of light having a wavelength of 300 nm to 1200 nm with a spectrophotometer (for example, an ultraviolet spectrophotometer "V-670" manufactured by JASCO Corporation or "U-4100" manufactured by Hitachi High-Technologies Corporation), and then obtaining a transmission rate of light having a wavelength of 425 nm and of light having a wavelength of 675 nm.

The pigment component is contained in the infrared-light-transmitting dark color ink of the present invention. In the infrared-light-transmitting dark color ink, the content of the pigment component is preferably 20 parts by mass to 40 parts by mass with respect to 100 parts by mass of the resin component. Herein, when the infrared-light-transmitting dark color ink contains a pigment component containing an organic pigment such as an oxazine pigment, it is known that when the content of the pigment component is set to 30 parts by mass or more, there is an adverse effect on the adhesiveness of the curing agent and the adhesiveness of the infrared-light-transmitting dark color layer 60 is decreased. For this reason, it is considered that there is difficulty using the infrared-light-transmitting dark color ink particularly for attaching sheets to each other. However, the brown pigment and the phthalocyanine pigment have higher dispersibility than other pigments and have a small influence on adhesiveness of the curing agent. Therefore, even when the content ratio of the pigment component is set to 30 parts by mass or more with respect to 100 parts by mass of the resin component, a decrease in adhesiveness and adhesiveness durability of the infrared-light-transmitting dark color layer 60 can be suppressed to a very small range. As described later, when the blending ratio of the pigment component in the infrared-light-transmitting dark color ink is set to be high, the color tone of the infrared-light-transmitting dark color layer 60 can be stabilized with a smaller coating amount. Incidentally, when the content of the pigment component in the infrared-light-transmitting dark color ink is set to 40 parts by mass or less with respect to 100 parts by mass of the resin component, the infrared-light-transmitting dark color layer 60 formed by the infrared-light-transmitting dark color ink of the present invention can be configured as the infrared-light-transmitting dark color layer 60 having adhesiveness and adhesion stability.

The infrared-light-transmitting dark color ink of the present invention can also contain a curing agent as necessary. According to the infrared-light-transmitting dark color ink of the present invention containing a curing agent, the infrared-light-transmitting dark color layer 60 having favorable adhesion to the resin sheet can be formed. By adjusting the content of the curing agent contained in the infrared-light-transmitting dark color ink, the infrared-light-transmitting dark color layer 60 which can attach sheets to each other can be formed. Hereinafter, the main agent and the curing agent will be described respectively as an embodiment which can configure the resin component contained in the infrared-light-transmitting dark color ink. Incidentally, the resin component related to the present invention is not intended to be limited to the following embodiment.

[Main Agent Component]

A polyurethane/polycarbonate diol-based component containing a mixture of polyurethane diol and aliphatic polycarbonate diol can be used as the main agent component of the resin component, for example. Both of polyurethane diol and aliphatic polycarbonate diol configuring the main agent are a polyol having a hydroxyl group and react with a curing agent having an isocyanate group to form an adhesive layer. In the present embodiment, when a mixture obtained by blending a predetermined amount of polyurethane diol and aliphatic polycarbonate diol is used as the main agent, adhesiveness and weather resistance of the infrared-light-transmitting dark color layer 60 can be improved.

Polyurethane diol which can be used in the main agent component is polyurethane having a urethane structure as a repeating unit and a hydroxyl group at both terminals thereof. The number average molecular weight of polyurethane diol is preferably 7000 to 13000. When the number average molecular weight is 7000 or more, reactivity with the curing agent is favorable, which is preferable. When the number average molecular weight is 13000 or less, dissolving in the solvent is improved, which is preferable.

The hydroxyl group value of polyurethane diol is preferably in a range of 10 mgKOH/g to 50 mgKOH/g. When the hydroxyl group value of polyurethane diol is 10 mgKOH/g or more, most of the curing agent component added reacts with a hydroxyl group contained in the main agent component, which is preferable. When the hydroxyl group value is 50 mgKOH/g or less, reaction with the curing agent proceeds well, which is preferable.

Since polyurethane diol improves the adhesiveness and weather resistance of the main agent component as the main agent component of the adhesive, polyurethane diol is obtained by reacting aliphatic polycarbonate diol, 1,6-hexanediol, and isophorone diisocyanate with one another. Hereinafter, aliphatic poly-carbonate diol, 1,6-hexanediol, and isophorone diisocyanate that are constituents of polyurethane diol will be described.

Aliphatic polycarbonate diol is a constituent of polyurethane diol which can react with isophorone diisocyanate described below. Aliphatic polycarbonate diol has a carbonate structure as a repeating unit and a hydroxyl group at both terminals thereof. The hydroxyl group at both terminals thereof is capable of curing with an isocyanate group.

Aliphatic polycarbonate diol can be produced with a method for producing aliphatic polycarbonate diol using alkylene carbonate and diol as a raw material or a method for producing aliphatic polycarbonate diol using diolkyl carbonate or diaryl carbonate and diol. Aliphatic polycarbonate diol which is used in the present embodiment can be produced by appropriately selecting the production method depending on the performance necessary for the main agent component.

Examples of alkylene carbonate which can be used for production of aliphatic polycarbonate diol include ethylene carbonate, trimethylene carbonate, 1,2-propylene carbonate, 1,2-butylene carbonate, 1,3-butylene carbonate, and 1,2-pentylene carbonate. Examples of diolkyl carbonate include dimethyl carbonate, diethyl carbonate, and dipropyl carbonate, and examples of diaryl carbonate include diphenyl carbonate.

Examples of diol may include a diol having no side chain such as ethylene glycol, 1, 3-propanediol, 1, 4-butanediol, 1,5-pentanediol, 1,6-hexanediol, or 1,7-heptanediol, a diol having a side chain such as 2-methyl-1,8-octanediol, neopentyl glycol, or 2-ethyl-1,6-hexanediol, and a cyclic diol such as 1,3-cyclohexanediol or 1,4-cyclohexanediol. Incidentally, one kind of diol may be used or a copolymer polycarbonate diol having two or more diols as a raw material may be used.

The number average molecular weight of aliphatic polycarbonate diol is preferably 1000 to 2000. When the number average molecular weight is 1000 or more, curing with diisocyanate easily occurs, which is preferable. When the number average molecular weight is 2000 or less, solubility in the solvent as an adhesive component is improved, which is preferable. In the production of polycarbonate diol, aliphatic polycarbonate diol has high reactivity as a monomer and is easy to highly polymerize. For these reason, in order to obtain polycarbonate diol having a predetermined number average molecular weight, it is necessary to control the reaction speed and the like.

A commercially available product can also be used as the aliphatic polycarbonate diol. In order to obtain an adhesive that is excellent in terms of durability, weather resistance, heat resistance, and hydrolysis resistance, for example, aliphatic polycarbonate diol having a number average molecular weight of 1000 (product name "DURANOL T5651" manufactured by Asahi Kasei Chemicals Corporation) and aliphatic polycarbonate diol having a number average molecular weight of 2000 (product name "DURANOL T5662" manufactured by Asahi Kasei Chemicals Corporation) can be suitably used.

1,6-hexanediol is an aliphatic diol and can form polyurethane diol by reaction with isophorone diisocyanate described below. 1,6-hexanediol is in a liquid state at normal temperature and can be dissolved in a solvent that is an adhesive component.

Polyester diol can be used together with 1,6-hexanediol. Polyester diol is a polyol having two or more hydroxyl groups, similarly to 1,6-hexanediol. Further, polyester diol can form ester with carboxylic acid having a bulky aromatic ring in a basic skeleton thereof. For this reason, it is possible to provide excellent curing speed and cohesive force to polyurethane diol obtained by reaction with isophorone diisocyanate. As polyester diol, for example, aromatic polyester diol produced by using isophthalic acid can be mentioned. Incidentally, polyester diol in the present embodiment can be produced by selecting a combination of a predetermined carboxylic acid compound and a diol according to a standard method.

The number average molecular weight of polyester diol is preferably 3000 to 4000. When the number average molecular weight of polyester diol is 3000 or more, reactivity with the curing agent is improved, which is preferable. When the number average molecular weight of polyester diol is 4000 or less, solubility in the solvent is improved, which is preferable.

Isophorone diisocyanate is a constituent of polyurethane diol and is alicyclic polyisocyanate. Isophorone diisocyanate reacts with a hydroxyl group of aliphatic polycarbonate diol, 1, 6-hexanediol, or polyester diol described above to form polyurethane diol serving as a main agent component.

A solution of polyurethane diol serving as a main agent component can be obtained by dissolving aliphatic polycarbonate diol, aliphatic diol, and isophorone diisocyanate, which are described above, in a solvent, mixing the resultant solution, and causing the resultant solution to react by heating to reflux. In the reaction, the hydroxyl groups at both terminals of each of the aliphatic polycarbonate diol and the aliphatic diol react with an isocyanate group of isophorone diisocyanate to form a urethane bond and then are cured.

The blending ratio of 1, 6-hexanediol in a reaction system in which polyurethane diol serving as a main agent component is produced is preferably 5 parts by mass to 15 parts by mass with respect to 100 parts by mass of aliphatic polycarbonate diol, and more preferably 2 parts by mass to 8 parts by mass. When the blending ratio of 1, 6-hexanediol is 5 parts by mass or more, an adhesive component having durability can be obtained, which is preferable. When the blending ratio of 1,6 -hexanediol is 15 parts by mass or less, solubility in the solvent is improved, which is preferable.

The blending ratio of polyester diol in the reaction system in which polyurethane diol is produced is preferably 50 parts by mass to 100 parts by mass with respect to 100 parts by mass of aliphatic polycarbonate diol. When the blending ratio of polyester diol is 50 parts by mass or more, an adhesive component having durability can be obtained, which is preferable. When the blending ratio of polyester diol is 100 parts by mass or less, solubility in the solvent is improved, which is preferable.

Incidentally, a solvent, which can be used in the case of causing aliphatic polycarbonate diol, aliphatic diol, and isophorone diisocyanate to react with one another, is not particularly limited as long as it can dissolve these compounds and does not react with the solvent. For example, from the viewpoint of compatibility with a solvent or the like and workability in lamination, a carboxylic acid ester-based solvent such as ethyl acetate can be mentioned.

Aliphatic polycarbonate diol serving as a main agent component reacts with a curing agent component having an isocyanate group. The same aliphatic polycarbonate diol which is used when the polyurethane diol is produced can be used as aliphatic polycarbonate The main agent component is a mixture of the polyurethane diol and the aliphatic polycarbonate diol described above. Regarding the mass ratio of polyurethane diol and aliphatic polycarbonate diol in the mixture, the content of aliphatic polycarbonate diol is preferably 10 parts by mass to 20 parts by mass with respect to 100 parts by mass of polyurethane diol. When the amount of aliphatic polycarbonate diol is 10 parts by mass or more, adhesion force is properly decreased, which is preferable. When the amount of aliphatic polycarbonate diol is 20 parts by mass or less, reaction between polyurethane diol and the curing agent easily occurs, which is preferable.

Incidentally, in addition to polyurethane diol and aliphatic polycarbonate diol serving as main agent components, in the main agent, as necessary, a tackifier, a stabilizer, a filler, a plasticizer, a softening point improver, a catalyst, or the like can be mixed as additives. Examples of the tackifier include a rosin-based resin and a terpene-based resin. Examples of the stabilizer include an antioxidant and an ultraviolet ray inhibitor. Examples of the filler include an inorganic filler.

[Curing Agent]

As the curing agent which can be used in the infrared-light-transmitting dark color ink, for example, a curing agent having a polyisocyanate compound as a main component is mentioned. The polyisocyanate compound is a compound having two or more isocyanate groups in one molecule. This isocyanate group reacts with a hydroxyl group in the polyurethane diol compound of the main agent to crosslink the polyurethane diol compound. Such a polyisocyanate compound is not particularly limited as long as it can cross ink the polyurethane diol compound of the main agent. For example, polyurethane diisocyanate, hexamethylene diisocyanate (hereinafter, "HDI"), isocyanurate-modified isophorone diisocyanate (hereinafter, "nurate-modified IPDI"), and the like can be exemplified. Among these polyisocyanate compounds, a mixture obtained by combining HDI and nurate-modified IPDI is preferable from the viewpoint of improving reactivity with a hydroxyl group. Incidentally, when a mixture of HDI and nurate-modified IPDI is used as a curing agent, HDI and nurate-modified IPDI are preferably used in a range of 70:30 to 50:50 (mass ratio).

[Blending of Main Agent and Curing Agent]

When the component of the infrared-light-transmitting dark color ink contains a curing agent and is used for attaching base materials to each other, the blending ratio of the main agent and the curing agent is preferably in a range of 1.0 to 3.5 in terms of a ratio of (the isocyanate group derived from the polyisocyanate compound)/(the hydroxyl group derived from the polyurethane diol compound), and is more preferably in a range of 1.2 to 3.0. When the blending ratio of the polyurethane diol compound of the main agent component and the polyisocyanate compound of the curing agent component is in the above range, the infrared-light-transmitting dark color ink capable of strongly attaching each base material can be obtained, which is preferable.

[Additive such as Silane Coupling Agent]

In addition to the above-described compounds, as necessary, a silane coupling agent, a tackifier, a stabilizer, a filler, a plasticizer, a softening point improver, a catalyst, or the like can be mixed as an additive. Examples of the silane coupling agent may include a silane monomer such as methyl trimethoxysilane or methyl triethoxysilane, vinylsilane such as vinyl triethoxysilane or vinyl trimethoxysilane, methacrylsilane such as 3-methacryloxypropyl triethoxysilane or 3-methacryloxypropyl trimethoxysilane, and epoxy silane such as 3-glycidoxy propyl trimethoxysilane or 2-(3, 4-epoxycyclohexyl)ethyl trimethoxysilane. Examples of the tackifier include a rosin-based resin and a terpene-based resin. Examples of the stabilizer include an antioxidant and an ultraviolet ray inhibitor. Examples of the filler include an inorganic filler.

Incidentally, the added amount of the silane coupling agent is preferably 1% by mass to 3% by mass with respect to a total of 100 parts by mass of the main agent of the infrared-light-transmitting dark color ink and the curing agent. When the added amount of the silane coupling agent is 1% by mass or more, adhesion force is favorable, which is preferable. When the added amount of the silane coupling agent is 3% by mass or less, durability is improved, which is preferable.

[Solvent]

In order to obtain favorable coating property and handling suitability, a solvent component is preferably added as a composition of the infrared-light-transmitting dark color ink. As such a solvent component, the above-described carboxylic acid ester such as ethyl acetate, methyl acetate, or methyl propionate can be exemplified, but the solvent component is not limited thereto. Incidentally, when the solvent is configured as a two-component type including a main agent and a curing agent, a solvent component used in the main agent and a solvent component used in the curing agent are independently selected and may be the same as or different from each other.

Incidentally, the composition of the infrared-light-transmitting dark color ink is not limited thereto, and any composition form, including an aqueous type, a solution type, an emulsion type, a dispersion type, and the like may be employed. The shape thereof may be any form including a film/sheet shape, a powder, a solid, an adhesive, and the like. Further, regarding the adhesion mechanism, any mechanism type including a chemical reaction type, a solvent evaporation type, a thermal melting type, a thermal pressure type, and the like may be employed.

<Infrared Light-Reflecting Sheet>

The infrared-light-reflecting sheet can be produced by using the infrared-light-transmitting dark color ink. Like the infrared-light-reflecting sheet 6 of FIG. 2, a laminate in which the transparent adhesion layer 62, the infrared-light-transmitting dark color layer 60, and the reflective layer 61 are laminated can be exemplified as the infrared-light-reflecting sheet. Incidentally, the infrared-light-reflecting sheet 6 of FIG. 2 is used as a rear surface protective sheet for a solar cell module. However, the use application of the infrared-light-reflecting sheet of the present invention is not intended to be limited to the rear surface protective sheet for the solar cell module. Hereinafter, each layer configuring the infrared-light-reflecting sheet will be described.

[Infrared-Light-Transmitting Dark Color Layer]

The infrared-light-transmitting dark color layer 60 according to the present embodiment is a layer containing a main agent resin having a hydroxyl group, a curing agent having an isocyanate group, and a pigment component. The infrared-light-transmitting dark color layer 60 according to the present embodiment contains a main agent resin having a hydroxyl group and a curing agent having an isocyanate group and has the function of attaching sheets to each other.

The infrared-light-transmitting dark color layer 60 according to the present embodiment can be formed by applying or laminating the infrared-light-transmitting dark color ink containing a curing agent, which is described above, on the reflective layer 61 and/or the transparent adhesion layer 62 and then performing dry curing thereon. As a coating method, the infrared-light-transmitting dark color ink can be applied by coating methods such as a roll coating method, a gravure roll coating method, and a kiss coating method, or a printing method.

Herein, when the infrared-light-transmitting dark color ink containing an organic dark color pigment of the related art such as an oxazine-based compound is used, in order to achieve balance among design attractiveness, infrared-light-transmitting property, and adhesiveness and adhesion stability that are necessary for a lamination member, the coating amount thereof needs to be set to 10 $g/m^2$ or more. However, when the infrared-light-transmitting dark color ink containing a curing agent of the present embodiment is used, it is possible to sufficiently achieve balance among the above with the coating amount set in a range of 5 $g/m^2$ to 15 $g/m^2$, more preferably 5 $g/m^2$ to 7 $g/m^2$. The reason for this is that when the content of the pigment component is 20 parts by mass to 40 parts by mass, preferably 30 parts by mass to 40 parts by mass with respect to 100 parts by mass of the resin component, color tone can be sufficiently stabilized with a coating amount smaller than that, in the related art. Incidentally, this also leads to an increase in yield of the infrared-light-reflecting sheet produced by using the infrared-light-transmitting dark color ink of the present invention and an improvement in productivity.

The brown pigment and the phthalocyanine pigment have higher dispersibility than other pigments and have a small influence on adhesiveness of the curing agent. For these reasons, a decrease in adhesiveness and adhesion stability caused by the pigment content can be suppressed. Incidentally, the thickness of the infrared-light-transmitting dark color layer 60 is preferably in a range of 5 μm to 15 μm, and more preferably in a range of 5 μm to 7 μm.

[Reflective Layer]

The reflective layer 61 is formed by a resin sheet containing a white pigment or a resin sheet having a coat layer (coating layer or printing layer), which contains a white pigment, formed therein and is a white resin layer reflecting near infrared light. The reflective layer 61 has the function of reflecting near infrared light which has been transmitted through the infrared-light-transmitting dark color layer 60. For this reason, for example, when the infrared-light-reflecting sheet 6 of the present embodiment is used as the rear surface protective sheet for the solar cell module, the infrared-light-reflecting sheet 6 of the present embodiment becomes the infrared-light-reflecting sheet (rear surface protective sheet) 6 which can sufficiently contribute to improvement in the electric power generation efficiency of a solar cell module 1. Incidentally, in the present specification, a product obtained by processing a resin in a sheet shape is called a "resin sheet" but this term is used as a concept also including a resin film.

As the resin sheet configuring the reflective layer 61, it is possible to preferably use a resin sheet of a fluororesin such as polytetrafluoroethylene (PTFE) or a copolymer of ethylene and tetrafluoroethylene (ETFE), a polyester-based resin such as poly(meth)acrylic resin or polyethylene terephthalate (PET), and the like. Herein, in the present embodiment, since the reflective layer 61 is disposed as the outermost layer of the solar cell module 1, high weather resistance, barrier properties, and hydrolysis resistance are required. From such a viewpoint, among them, a fluororesin represented by ETFE or a polyester-based resin represented by PET is particularly preferably used.

The reflective layer 61 needs to have the function of reflecting near infrared light. For this reason, a white resin layer containing a white pigment having a particle diameter of 0.5 μm to 1.5 μm is preferably used, and the particle diameter is more preferably 0.8 μm to 1.2 μm. In the reflective layer 61, it is preferable that the content of the particles having a particle diameter of 0.8 μm to 1.2 μm of the white pigment is 80% by mass or more of the particles of the entire white pigment. When the particle diameter and the distribution ratio of the white pigment are adjusted to the above ranges, the white resin layer can efficiently reflect near infrared light. When the infrared-light-reflecting sheet of the present invention is used as the rear surface protective sheet for the solar cell module, the white pigment, contributes to improvement in the electric power generation efficiency of the solar cell module. The expression "reflecting near infrared light" means the function in which the integrated reflection rate in a wavelength range of about 750 nm to 2200 nm is 85% or more.

A representative example of the white pigment having a particle diameter of 0.5 μm to 1.5 μm is titanium oxide, and also in the present invention, titanium oxide is preferably used as the white pigment. Herein, titanium oxide also includes surface-treated titanium oxide. For example, when the white pigment having the above particle diameter range is titanium oxide, the production thereof can be performed as follows.

Aqueous titanium oxide is used as a raw material, 0.1% by mass to 0.5% by mass of aluminum compound in terms of aluminum oxide, 0.1% by mass to 0.5% by mass of potassium compound in terms of potassium carbonate, and 0.2% by mass to 1.0% by mass of zinc compound in terms of zinc oxide with respect to the titanium oxide content are added to the aqueous titanium oxide, and the resultant mixture is dried and roasted so that a white pigment having the above particle diameter range which is mainly formed by titanium oxide can be produced.

As the production method of the reflective layer 61, for example, a method in which a coat layer containing a white pigment is formed on a resin sheet, and a method in which a white pigment is kneaded into a resin sheet are mentioned. There is no particular limitation to both methods, and the reflective layer can be produced by methods of the related arts.

When a coat layer (coating layer or printing layer) containing a white pigment is formed on a resin sheet, a general vehicle for coating or for ink is used as a main component and the white pigment is added thereto. Further, as necessary, an ultraviolet absorbent, a cross-linking agent, or other additives are arbitrarily added to prepare a composition for coating or for ink, the composition is applied or printed on a surface of a base film by using a general coating method or a printing method, and the coating layer or printing layer thereof can be formed.

When the white pigment is kneaded into a resin sheet, a resin configuring the resin sheet is used as a main component and the white pigment is added thereto. Further, as necessary, other additives are arbitrarily added to prepare a resin composition, and a sheet obtained subjecting the white pigment to kneading processing can be produced, for example, by a film molding method such as an extruding method or a T die method.

[Transparent Adhesion Layer]

The transparent adhesion layer 62 according to the present embodiment is a layer which transmits near infrared light and is disposed as the outermost layer of the infrared-light-reflecting sheet 6. The transparent adhesion layer 62 is a layer having adhesion with another resin layer, and for example, is a layer having adhesiveness with an ethylene-vinyl acetate copolymer resin (EVA resin) or a resin layer containing polyolefin such as polyethylene. For this reason, like the transparent adhesion layer 62 of FIG. 2, a rear surface sealing material layer 5 and the transparent adhesion layer 62 can be laminated to be brought into close contact with each other.

It is required that the transparent adhesion layer 62 according to the present embodiment transmits near infrared light reflected by the reflective layer 61 or is transparent or translucent depending on the requirements of design attractiveness. From such a viewpoint, a polyethylene resin, a polyolefin resin such as a polypropylene resin, and polyethylene terephthalate (PET) are preferably used for the transparent adhesion layer 62.

[Other Layers]

In the infrared-light-reflecting sheet 6 of the present embodiment, other layers may be provided within a range not impairing the effects of the present invention. For example, a weather resistance layer (not illustrated) formed by a fluororesin, polyethylene terephthalate (PET), or the like may be further laminated on the side opposite to the lamination surface of the transparent adhesion layer 62 of the reflective layer 61, that is, on the outermost side of the infrared-light-reflecting sheet 6. In this case, in order to improve design attractiveness, the weather resistance layer may be darkly colored. Alternatively, for example, another transparent reinforcement layer (not illustrated) for increasing the strength of the rear surface protective sheet 6 may be provided between the reflective layer 61 and the transparent adhesion layer 62.

An infrared-light-transmitting coat layer containing an organic dark color pigment may be further laminated on the surface opposite to the lamination surface of the infrared-light-transmitting dark color layer 60 of the reflective layer 61. When the infrared-light-transmitting dark color layer and the infrared-light-transmitting coat layer are laminated respectively, both surfaces of the infrared-light-reflecting sheet can be unified with a dark color. Since the infrared-light-reflecting sheet of the present embodiment is the infrared-light-reflecting sheet in which both surfaces are unified with a dark color, the infrared-light-reflecting sheet of the present embodiment is preferable in terms of design attractiveness.

Further, when the infrared-light-transmitting coat layer according to the present embodiment is formed to be a layer transmitting near infrared light having a wavelength of 750 nm to 1500 nm similarly to the infrared-light-transmitting dark color layer 60, heat generation caused by absorption of near infrared light having a wavelength of 750 nm to 1500 nm can be suppressed.

Specific examples of the organic dark color pigment contained in the infrared-light-transmitting coat layer include oxazine, benzimidazolone, pyrrole, quinacridone, azo, perylene, dioxane, isoindolinone, indanthrene, quinophthalone, perinone, and phthalocyanine pigments. From the viewpoint of UV resistance, a dark color pigment composed of an oxazine-based organic pigment or at least one or more pigments selected from the group consisting of a benzimidazolone pigment, 4-[(2,5-dichlorophenyl)azo]-3-hydroxy-N-(2,5-dimethoxyphenyl)-2-naphthalenecarboxamide, 1-[(4-nitrophenyl)azo]-2-naphthalenol, bis[3-hydroxy-4-(phenylazo)-2-naphthalenecarboxylic acid]copper salt, C. I. Pigment Brown 7, N,N'-bis(2,4-dinitrophenyl)-3, 3'-dimethoxy-1,1'-biphenyl-4,4'-diamine, 3,4,9,10-perylenetetracarboxylic diimide, $\Delta$2,2'(1H,1'H)-binaphtho[2,1-b] thiophen-1,1'-dione, and N,N'-(10,15,16,17-tetrahydro-5,10, 15,17-tetraoxo-5H-dinaphtho[2,3-a:2',3'-i]carbazole-4,9-diyl)bis(benzamide), and a phthalocyanine pigment can be preferably used.

Incidentally, by kneading the pigment component contained in the infrared-light-transmitting dark color ink into the base film, similarly to the infrared-light-transmitting dark color layer 60, a dark color film or dark color sheet having high design attractiveness can be produced. This dark dolor film or dark color sheet can be used as the infrared-light-transmitting dark color layer in a multi-layered sheet. In the production of the dark color film or dark color sheet by kneading the pigment component into the base film, the content of the brown pigment in the pigment component is preferably 43 parts by mass to 233 parts by mass with respect to 100 parts by mass of the phthalocyanine pigment (the content ratio of the brown pigment and the phthalocyanine pigment is in a range of 30:70 to 70:30 in terms of mass ratio), and more preferably 66 parts by mass to 150 parts by mass (the content ratio of the brown pigment and the phthalocyanine pigment is in a range of 40:60 to 60:40 terms of mass ratio).

As described above, when the dark color film or dark color sheet is formed by kneading the pigment component into the base film, first, a thermoplastic resin configuring the base film is used as a main component, the pigment component is added thereto, and further, as necessary, one or two or more additives such as an ultraviolet absorbent, a plasticizer, a light stabilizer, an antioxidant, an antistatic agent, a cross-linking agent, a curing agent, a filler, a lubricant, a strengthening agent, a reinforcement agent, a fire retardant, a flame-resistant agent, a foaming agent, a fungicide, and a coloring agent (such as a pigment and a dye) are arbitrarily added. Further, as necessary, a solvent, a dilution agent, or the like is added and then the resultant mixture is sufficiently kneaded to prepare a thermoplastic resin composition. The thermoplastic resin composition prepared in this way is molded, for example, by using an extruder, a T-die extruder, a cast molding machine, an inflation molding machine, or the like according to a film molding method such as an extruding method, a T die method, a cast molding method, or an inflation method so that the dark color film or dark color sheet can be produced. Further, as necessary, for example, this film or sheet can also be produced, for example, by stretching the thermoplastic resin composition in the uniaxial or biaxial direction using a tenter system or tubular system.

When other layers are provided on the infrared-light-reflecting sheet, an adhesive layer for attaching respective layers may be formed at a plurality of positions. If each layer disposed between the transparent adhesion layer 62 and the infrared-light-transmitting dark color layer 60 is transparent at this time, when an arbitrary adhesive layer at the transparent adhesion layer side in relation to the reflective layer 61 among the plurality of adhesive layers is employed as the infrared-light-transmitting dark color layer 60, an infrared-light-reflecting sheet with sufficient weather resistance and durability can be obtained while the appearance is darkly colored. When the infrared-light-reflecting sheet of the present embodiment is diverted to the rear surface protective sheet for the solar cell module, the infrared-light-reflecting sheet of the present embodiment can be employed as the rear surface protective sheet which can sufficiently contribute to an improvement in electric power generation efficiency of the solar cell module. Such an infrared-light-reflecting sheet (rear surface protective sheet) is also in the scope of the present invention.

[Rear Surface Protective Sheet for Solar Cell Module]

Figure 1:
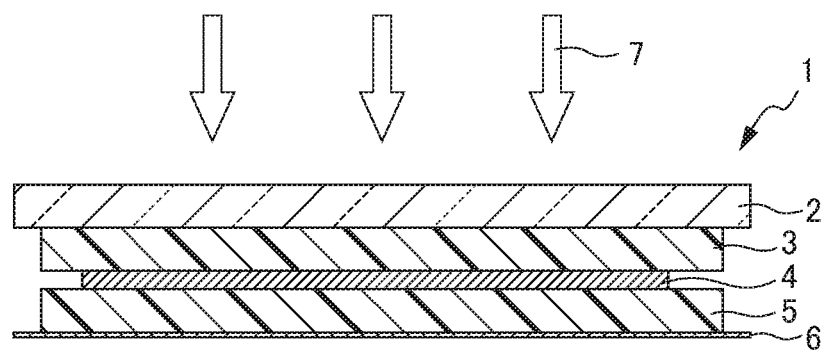
FIG. 1 is a sectional schematic view illustrating an example of a layer structure of a solar cell module.

A preferred usage example of the infrared-light-reflecting sheet of the present embodiment will be described. For example, when the infrared-light-reflecting sheet 6 of the present embodiment is disposed at a non-photoreception surface side of the solar cell element of the solar cell module, the infrared-light-reflecting sheet 6 of the present embodiment can be used as a rear surface protective sheet for a solar cell module. FIG. 1 is a sectional schematic view illustrating an example of a layer structure of a solar cell module. The solar cell module 1 configuring a solar cell has a configuration in which a transparent front substrate 2, a front surface sealing material layer 3, a solar cell element 4 the rear surface sealing material layer 5, and the rear surface protective sheet (infrared-light-reflecting sheet) 6 are laminated from a photoreception surface side of incident light 7 as illustrated in FIG. 1.

The rear surface protective sheet will be described by means of FIG. 2. The rear surface protective sheet 6 includes the infrared-light-transmitting dark color layer 60, the reflective layer 61, and the transparent adhesion layer 62. The reflective layer 61 and the transparent adhesion layer 62 are attached to each other with the infrared-light-transmitting dark color layer 60 interposed therebetween. In the solar cell module 1, the reflective layer 61 is disposed on the outermost layer side of the module, and the transparent adhesion layer 62 is disposed on the inner layer side of the module, that is, on the rear surface sealing material layer 5 side.

Herein, generally, most of sealing materials for solar cell modules are transparent or translucent. Therefore, when the solar cell module 1 is seen from the transparent front substrate 2 side, regarding a gap portion in which the solar cell element 4 is not disposed, the color of the infrared-light-transmitting dark color layer 60 is seen through the transparent adhesion layer 62. The surface of the solar cell element 4 black or has a dark color close to black in many cases. In particular, regarding thin film solar cell elements for which there is an increasing demand recently, surfaces of most products are black or have a dark color close to black. Since the infrared-light-transmitting dark color layer 60 is black or has a dark color close to black, the rear surface protective sheet 6 enables the appearances of a lot of solar cell modules, that is, the appearances of thin film solar cell modules mounted with thin film solar cell elements to be unified with black or a dark color close to black, and thus the solar cell modules can be configured as preferable solar cell modules in terms of design attractiveness.

In order to unify the appearance of the rear surface protective sheet (infrared-light-reflecting sheet) 6 with black or a dark color close to black, for example, a color difference ΔE*ab between a color tone of the infrared-light-transmitting dark color layer 60 and a color tone of carbon black as measured under the conditions of a D65 light source and a 10° view angle according to JIS-Z 8722 is preferably 10 or less and more preferably 7 or less.

Sunlight which is not absorbed in the solar cell element 4 is incident to the rear surface protective sheet 6 from the transparent adhesion layer 62 side. Most near infrared light included in sunlight transmits through the infrared-light-transmitting dark color layer 60 without being absorbed in the infrared-light-transmitting dark color layer 60, and thus reaches the reflective layer 61. Since the reflective layer 61 reflects near infrared light, most of infrared light which has reached the reflective layer 61 is reflected to return to the infrared-light-transmitting dark color layer 60. The reflected infrared light transmits through the infrared-light-transmitting dark color layer 60 and is further reflected to be absorbed in the solar cell element 4. The infrared-light-transmitting dark color layer 60 does not absorb infrared light, and thus heat generation caused by absorption of near infrared light can be suppressed. As a result, a decrease in electric power generation efficiency caused by heat generation of the solar cell module 1 can be prevented.

Further, the infrared-light-transmitting dark color ink of the present invention contains the brown pigment and the phthalocyanine pigment at a predetermined ratio. For this reason, a transmission rate of near infrared light is even higher than in the case of using the infrared-light-transmitting dark color ink of the related art. Accordingly, absorption of near infrared light is suppressed to suppress an increase in temperature of the solar cell module, and the electric power generation efficiency of the solar cell module can be further increased by using infrared light in power generation. Therefore, the electric power generation efficiency of the solar cell module using the infrared-light-reflecting sheet of the present invention as the rear surface protective sheet is further improved.

Incidentally, in the thin film solar cell module, the suppression of heat generation of all constituents in the module does not necessarily contribute to an improvement in electric power generation efficiency, but the surface temperature of the solar cell element that is black or has a dark color is preferably increased to 50° C. to 70° C. with reference to the relation with the annealing effect. When the infrared-light-reflecting sheet of the present embodiment is used as the rear surface protective sheet, in order to satisfy the demand related to design attractiveness, while the appearance of the infrared-light-reflecting sheet is defined to be black or have a dark color close to black, the near infrared light reflected by the reflective layer 61 is not accumulated inside the rear surface protective sheet 6 but the near infrared light can be absorbed by the solar cell element 4 without any loss. According to this, it is possible to efficiently increase the surface temperature of the thin film solar cell element that is black or has a dark color to the above-described temperature. Also from such a viewpoint, the infrared-light-reflecting sheet of the present invention can particularly preferably be used as the rear surface protective sheet of the thin film solar cell module.

[Production Method of Rear Surface Protective Sheet for Solar Cell Module]

The rear surface protective sheet 6 can be produced by providing the infrared-light-transmitting dark color layer 60 between the reflective layer 61 and the transparent adhesion layer 62 and then performing dry lamination processing on the obtained product. Incidentally, by providing other layers, even when the adhesive layer includes a plurality of layers, respective layers can be brought into close contact with each other to be laminated.

[Production Method of Solar Cell Module]

As the production method of the solar cell module 1 constituting the solar cell, a method of sequentially laminating respective members constituting the solar cell and integrating the obtained product by vacuum heat lamination processing can be used. The lamination temperature at this time is preferably set in a range of 130° C. to 190° C. The lamination time is preferably in a range of 5 minutes to 60 minutes, and particularly preferably in a range of 8 minutes to 40 minutes. In this way, the respective members constituting the solar cell are integrated and thermally pressed so that the solar cell module 1 can be produced.

<Another Embodiment of Infrared-Light-Reflecting Sheet>

Another embodiment of the infrared-light-reflecting sheet of the present invention will be described by means of FIG. 6. (Incidentally, as necessary, for distinguishing from the infrared-light-reflecting sheet 6 of the present embodiment in FIG. 6, the infrared-light-reflecting sheet in which the infrared-light-transmitting dark color layer including the infrared-light-transmitting dark color layer 60 has the function of attaching sheets to each other is laminated, like the infrared-light-reflecting sheet 6 of FIG. 2 is described as the "infrared-light-reflecting sheet of the above-described embodiment.) The infrared-light-transmitting dark color layer 60 of the infrared-light-reflecting sheet of the present embodiment is the infrared-light-transmitting dark color layer 60 not having the function of attaching sheets to each other, and two layers among layers laminated between the transparent adhesion layer 62 and the reflective layer 61 are the infrared-light-transmitting dark color layer 60 and the transparent adhesive layer 63. From the viewpoint of design attractiveness, there is a case where the entire surface of the sheet is not darkly colored, but an infrared-light-reflecting sheet partially colored is required, for example, for providing a design such as patterning. When such an infrared-light-reflecting sheet is produced, for example, the infrared-light-transmitting dark color ink having an infrared-light-transmitting property is partially applied to a resin sheet such as the transparent adhesion layer and/or the reflective layer in advance, and the infrared-light-transmitting dark color ink partially applied in this way is cured to form the infrared-light-transmitting dark color layer 60. Thereafter, a transparent adhesive not mixed with a pigment is applied and cured to form a transparent adhesive layer, and the reflective layer and the transparent adhesion layer are laminated. By performing lamination in this way, an infrared-light-reflecting sheet having a design such as patterning can be produced by performing partial coloring.

Even in the case of the infrared-light-reflecting sheet in which an infrared-light-transmitting dark color layer and a transparent easy-adhesive layer transmitting all light beams are laminated in this order on the surface of the reflective layer instead of the transparent adhesion layer 62 and the transparent adhesive layer 63, the infrared-light-transmitting dark color layer 60 is formed by partially applying the infrared-light-transmitting dark color ink to the reflective layer and curing the infrared-light-transmitting dark color ink so that the infrared-light-reflecting sheet having a design such as patterning can be produced similarly. When the transparent easy-adhesive layer is laminated instead of the transparent adhesive layer and the transparent adhesion layer, the number of layers of the infrared-light-reflecting sheet can be decreased, which is preferable in terms of productivity.

Since the infrared-light-transmitting dark color layer 60 is formed by the infrared-light-transmitting dark color ink, the infrared-light-transmitting dark color layer 60 transmits near infrared light. Since the transparent adhesive layer does not contain a pigment absorbing infrared light, the transparent adhesive layer also transmits near infrared light. The reflective layer reflecting near infrared light having a wavelength of 750 nm to 1500 nm can reflect near infrared light which has been transmitted through the infrared-light-transmitting dark color layer 60 and the transparent adhesive layer. For this reason, also when the infrared-light-reflecting sheet of this embodiment is used as the rear surface protective sheet for the solar cell module, near infrared light which has been transmitted through the infrared-light-transmitting dark color layer 60 and the transparent adhesive layer can be also used again for electric power generation (see FIG. 6). When the infrared-light-reflecting sheet of the present embodiment is used as the rear surface protective sheet for the solar cell module, the rear surface protective sheet becomes an excellent solar cell module rear surface protective sheet which is also excellent in terms of design attractiveness and can maintain electric power generation efficiency as high as that in the related art.

[Infrared-Light-Transmitting Dark Color Layer]

Hereinafter, the infrared-light-reflecting sheet in this embodiment will be described while focusing on specific portion of this embodiment. The infrared-light-transmitting dark color layer 60 is manly disposed as a laminate between the reflective layer 61 and the transparent adhesion layer 62. The infrared-light-transmitting dark color layer 60 may be laminated on the entire surface of the transparent adhesion layer and/or the reflective layer or may be laminated only on a part of the surface of the transparent adhesion layer and/or the reflective layer. The infrared-light-reflecting sheet in which the infrared-light-transmitting dark color layer 60 is laminated only on a part of the surface of the transparent adhesion layer and/or the reflective layer is an infrared-light-reflecting sheet with high design attractiveness. Incidentally, this infrared-light-transmitting dark color layer 60 may be attached, for example, to the transparent adhesion layer 62 as illustrated in FIG. 6, or in addition to a case other than the case illustrated in FIG. 6, may be laminated on the inner side of the reflective layer 61 while the infrared-light-transmitting dark color layer 60 is in contact with the reflective layer 61 as long as the infrared-light-transmitting dark color layer 60 is disposed at the photoreception surface side in relation to the reflective layer 61.

In the infrared-light-reflecting sheet of the present embodiment, similarly to the infrared-light-reflecting sheet of the above-described embodiment, the infrared-light-transmitting dark color layer 60 is configured by a cross-linked resin in which the main agent resin having a hydroxyl group (hereinafter, also simply referred to as "main agent resin") is cross-linked by an isocyanate-based curing agent. The infrared-light-transmitting dark color layer 60 can be formed by applying the infrared-light-transmitting dark color ink, which contains the main agent resin, the curing agent, the solvent, and the pigment component containing the brown pigment and the phthalocyanine pigment, to the surface of the resin sheet and drying and curing the applied infrared-light-transmitting dark color ink.

In the case of the infrared-light-transmitting dark color ink forming the infrared-light-transmitting dark color layer on the surface of the transparent adhesion layer and/or the reflective layer like the infrared-light-transmitting dark color ink of the present embodiment, the content of the pigment component is preferably 20 parts by mass to 50 parts by mass with respect to 100 parts by mass of the resin component in the main agent, and more preferably 35 parts by mass to 45 parts by mass. When the content of the pigment component is adjusted in this range, the color tone can be further stabilized. Since the infrared-light-transmitting dark color layer 60 can be formed by a small amount of the infrared-light-transmitting dark color ink, even when the infrared-light-transmitting dark color layer 60 is laminated only on a part of the surface of the resin sheet, a step difference between the surface on which the infrared-light-transmitting dark color layer 60 is laminated and the surface on which the infrared-light-transmitting dark color layer 60 is not laminated becomes small. For this reason, the transparent adhesion layer 62 and the reflective layer 61 can be laminated with a small amount of transparent adhesive via the transparent adhesive layer 63, and thus the infrared-light-reflecting sheet can be produced in low costs. Even in the case of the infrared-light-reflecting sheet in which the infrared-light-transmitting dark color layer and the transparent easy-adhesive layer transmitting all light beams are laminated in this order on the surface of the reflective layer instead of the transparent adhesion layer 62 and the transparent adhesive layer 63, lamination can be carried out with a small amount of a primer agent via other layers such as the reflective layer 61 and the rear surface sealing material layer 5. For this reason, the infrared-light-reflecting sheet can be produced at low cost.

In the production process of the infrared-light-reflecting sheet of the present embodiment, the resin sheet on which the infrared-light-transmitting dark color layer is formed is exposed on the outermost surface once in the pre-process of applying a transparent adhesive or a primer agent. For this reason, the infrared-light-transmitting dark color layer according to the present embodiment having no function of attaching sheets to each other requires blocking resistance.

Regarding the blending ratio of the main agent and the curing agent in the infrared-light-reflecting sheet of the present embodiment, a NCO/OH ratio that is a ratio of an NCO value of the curing agent to an OH value of the main agent resin is in a range of 1.0 to 2.0. When the NCO/OH ratio is set to 2.0 or less, blocking resistance of the infrared-light-transmitting dark color layer 60 can be improved. When the NCO/OH ratio is set to 1.0 or more, adhesion between the infrared-light-transmitting dark color layer 60 and the resin sheet can be improved.

From the viewpoint of adhesion between the infrared-light-transmitting dark color layer 60 and the resin sheet and blocking resistance of the infrared-light-transmitting dark color layer 60, when polyurethane/polycarbonate diol-based component is used as the main agent component of the resin component, the number average molecular weight of polyurethane diol is preferably 6000 to 8000 and the hydroxyl group value of polyurethane diol is preferably 15 mgKOH/g. As the curing agent, a mixture of an isocyanurate-modified product of hexamethylene diisocyanate (HDI nurate product) and a TMP adduct-modified product of isophorone diisocyanate (IPDI) at a ratio of 1:1 (mass ratio) is preferably used.

A coating amount of the infrared-light-transmitting dark color ink in the infrared-light-reflecting sheet of the present embodiment is preferably in a range of 3 g/m$^2$ to 7 g/m$^2$. When the coating amount of the infrared-light-transmitting dark color ink is set to 3 g/m$^2$ or more, the color tone of the infrared-light-transmitting dark color layer 60 can be made sufficient. When the coating amount of the infrared-light-transmitting dark color ink is set to 7 g/m$^2$ or less, a step difference between the surface on which the infrared-light-transmitting dark color layer 60 is laminated and the surface on which the infrared-light-transmitting dark color layer 60 is not laminated becomes small. For this reason, the reflective layer 61 and the transparent adhesion layer 62 can be laminated with a small amount of a transparent adhesive via the transparent adhesive layer 63, and thus the infrared-light-reflecting sheet can be produced at low cost.

[Transparent Adhesive Layer]

The transparent adhesive layer 63 is an adhesive layer provided mainly for attaching the reflective layer 61 and the transparent adhesion layer 62 to each other. In the present embodiment, the transparent adhesive layer 63 is formed by curing the transparent adhesive applied to the upper surface of the reflective layer 61 or the lower surface of the transparent adhesion layer 62 facing the upper surface after lamination.

The transparent adhesive layer 63 requires sufficient adhesiveness and adhesiveness durability. Further, in order to reflect near infrared light, the transparent adhesive layer 63 preferably has a property of transmitting this near infrared light.

A transparent adhesive having a characteristic of transmitting light having a wavelength of 750 nm to 1500 nm in a state of being cured similarly to the infrared-light-transmitting dark color ink of the present embodiment is preferably used for the transparent adhesive forming the transparent adhesive layer 63.

The adhesive composition used in the transparent adhesive layer 63 is, similarly to the infrared-light-transmitting dark color ink of the present embodiment, preferably a two-component type including the main agent and the curing agent, and from the viewpoint of coating property and handling property, a solvent is suitably contained in the composition.

The main agent resin component of the transparent adhesive used in the transparent adhesive layer is, similarly to the infrared-light-transmitting dark color ink of the present embodiment, preferably a polyurethane/polycarbonate diol-based component containing a mixture of polyurethane diol and aliphatic polycarbonate diol, when the mixture obtained by blending a predetermined amount of a specific polyurethane diol and aliphatic polycarbonate diol is used as the main agent, adhesiveness and weather resistance of the transparent adhesive layer are improved.

The adhesive composition used in the transparent adhesive layer 63 according to the present embodiment contains the main agent and the curing agent as main components. The blending ratio of the main agent and the curing agent may be the same as in the infrared-light-transmitting dark color ink used in the infrared-light-reflecting sheet of the above-described embodiment. When the blending ratio of the polyurethane diol compound of the main agent component and the polyisocyanate compound of the curing agent component is set in the above range, an adhesive capable of strongly attaching each base material can be obtained, which is preferable. Incidentally, in addition to the above-described compound, as necessary, a silane coupling agent, a tackifier, a stabilizer, a filler, a plasticizer, a softening point improver, a catalyst, or the like can be mixed as an additive.

In order to obtain favorable coating property and handling suitability, a solvent component is preferably added to the transparent adhesive composition. As such a solvent component, the above-described carboxylic acid ester such as ethyl acetate, methyl acetate, or methyl propionate can be exemplified, but the solvent component is not limited thereto. Incidentally, as already described, the adhesive is configured as a two-component type including the main agent and the curing agent, but a solvent component used in the main agent and a solvent component used in the curing agent are independently selected and may be the same as or different from each other.

Incidentally, the transparent adhesive composition is not limited thereto, and any composition form of an aqueous type, a solution type, an emulsion type, a dispersion type, and the like may be employed. The shape thereof may be any form of a film/sheet shape, a powder, a solid, and the like. In addition, regarding the adhesion mechanism, any mode of a chemical reaction type, a solvent evaporation type, a thermal melting type, a thermal pressure type, and the like may be employed.

The transparent adhesive layer 63 can be formed, for example, by applying or laminating the adhesive composition, which is described above, on the reflective layer 61 and/or the transparent adhesion layer 62 and then performing dry curing thereon.

[Transparent Adhesion Layer]

The same transparent adhesion layer as the layer used in the transparent adhesion layer used in the infrared-light-reflecting sheet of the above-described embodiment can be used as the transparent adhesion layer according to the present embodiment. A film or sheet produced by a film molding method such as an extruding method or a T die method may be used as the transparent adhesion layer according to the present embodiment.

[Transparent Easy-Adhesive Layer]

Instead of the transparent adhesive layer and the transparent adhesion layer, the transparent easy-adhesive layer may be formed between the rear surface sealing material layer 5 and the infrared-light-transmitting dark color layer 60. The transparent easy-adhesive layer is a so-called primer layer, a primer composition configuring the transparent easy-adhesive layer contains, for example, an olefin-based resin and an aqueous medium, and a primer composition substantially not containing an organic solvent can be used. When the transparent easy-adhesive layer is laminated instead of the transparent adhesive layer and the transparent adhesion layer, the number of layers of the infrared-light-reflecting sheet can be decreased, which is preferable in terms of productivity.

The olefin-based resin contained in the primer composition used for forming the transparent easy-adhesive layer (hereinafter, also simply referred to as "primer composition") is preferably an acid-modified polyolefin resin containing an olefin component and an unsaturated carboxylic acid component. The acid-modified polyolefin resin preferably has an MFR at 190° C. and a load of 2.16 kg as measured according to JIS K7210 of 0.01 g/10 min or more and less than 100 g/10 min. According to this, it is possible to form the transparent adhesion layer 62 which maintains favorable dispersibility in the aqueous medium at the stage of the primer composition and is excellent in adhesiveness to the olefin-based resin forming the rear surface sealing material layer 5.

For example, a primer composition described in JP 2013-74172 A can be used as the primer composition. Strong adhesiveness can be exhibited between the rear surface sealing material layer 5 and the infrared-light-transmitting dark color layer.

[Other Layers]

In the infrared-light-reflecting sheet of the present embodiment, similarly to the infrared-light-reflecting sheet of the above-described infrared-light-reflecting sheet, other layers may be provided within a range not impairing the effects of the present invention.

[Rear Surface Protective Sheet for Solar Cell Module]

The infrared-light-reflecting sheet of the present embodiment can be produced, for example, by using the reflective layer 61 or transparent adhesion layer 62 having the infrared-light-transmitting dark color layer 60 laminated thereon in advance and performing dry lamination processing therebetween via the transparent adhesive layer 63. Incidentally, by providing other layers, even when the transparent adhesive layer includes a plurality of layers, respective layers are brought into close contact with each other to be laminated in the similar method.

[Solar Cell Module]

In the infrared-light-reflecting sheet of the present embodiment, similarly to the production method of the solar cell module, respective members configuring the solar cell are sequentially laminated. For example, the solar cell module can be produced by performing vacuum heat lamination processing to integrate the respective members.

A usage example in which the infrared-light-reflecting sheet in which the surface can be partially colored is used as the rear surface protective sheet for the solar cell module like the infrared-light-reflecting sheet of the present embodiment will be described. Since most of sealing materials for solar cell modules are transparent or translucent, the color of the rear surface protective sheet 6 for the solar cell module can be recognized in a gap portion in which the solar cell element 4 is not disposed (non-element region) in plan view from the surface side in which the solar cell element is disposed. By using the infrared-light-reflecting sheet of the present embodiment, in plan view, when an element region gap portion (non-element region) is colored, the element region gap portion can be a dark color region having an average reflection rate of 10% or less in a wavelength range of 400 nm to 700 nm. When the element region in which the solar cell element is disposed is not colored, the element region can be a reflection region having an average reflection rate of 80% or more in a wavelength range of 1000 nm to 1200 nm.

EXAMPLES

Hereinafter, the present invention will be described in more detail by means of Examples and Comparative Examples. However, the present invention is not limited to the following Examples and the like.

For evaluating a near infrared light transmission rate, color coordinate-coating amount dependency, high-temperature discoloration property, adhesiveness, and adhesiveness durability of the infrared-light-transmitting dark color ink according to the present embodiment, each ink was produced by the following method and an infrared-light-reflecting sheet using the ink and a pseudo module sample were produced.

[Main Agent]

Ethylene glycol (32.3 parts by mass), 2,2-dimethyl-1,3-propanediol (270.8 parts by mass), 1,6-hexanediol (122.9 parts by mass), adipic acid (228.1 parts by mass), and isophthalic acid (664 parts by mass) were added to a flask equipped with a stirrer and a nitrogen gas introducing tube in a nitrogen atmosphere, the resultant mixture was subjected to nitrogen bubbling at 180° C. to 220° C. and reacted until an acid value of 2 mgKOH/g is reached, and then ethyl acetate (860 parts by mass) was added thereto, thereby obtaining a 50% polyester diol H solution. The hydroxyl group value of the obtained resin was 32 mgKOH/g and the number average molecular weight thereof was about 3500.

100 parts by mass of aliphatic polycarbonate diol having a number average molecular weight of 1000 (product name "DURANOL T5651" manufactured by Asahi Kasei Chemicals Corporation, hereinafter, abbreviated as "PDC 1000"), and polyester diol H (50 parts by mass), 1,6-hexanediol (2 parts by mass), isophorone diisocyanate (23.8 parts by mass), and ethyl acetate (175.8 parts by mass) which are described above were added to a flask equipped with a stirrer in a nitrogen atmosphere, and the resultant mixture was heated to reflux until isocyanate absorption at 2270 $cm^{-1}$ disappeared in the infrared absorption spectrum, thereby obtaining a 50% polyurethane diol solution. The hydroxyl group value of the obtained resin was 14 mgKOH/g and the number average molecular weight thereof was about 8000.

A main agent was prepared by mixing 100 parts by mass of polyurethane diol and 15 parts by mass of aliphatic polycarbonate diol (B) (PDC 1000), which are described above.

[Curing Agent]

A mixture of hexamethylene diisocyanate (HDI adduct: bifunctional) and isocyanurate-modified isophorone diisocyanate (nurate-modified IPDI) was used. The mixing ratio of the adduct-modified HDI and the nurate-modified IPDI, that is, (HDI adduct)/(nurate-modified IPDI) was set to 6:4 (mass ratio).

[Infrared-Light-Transmitting Dark Color Ink (Ink 1)]

Pigment: brown pigment (benzimidazolone pigment (Pigment Brown 25, particle diameter: 0.08 μm)), phthalocyanine pigment (amorphous phthalocyanine blue pigment (Pigment Blue 15, particle diameter: 0.15 to 0.20 μm))

Solvent: ethyl acetate

Ink 1 was prepared by dissolving the main agent (solid content proportion: 50% by mass), the curing agent (solid content proportion: 10% by mass), the brown pigment (benzimidazolone pigment), and the phthalocyanine pigment (amorphous phthalocyanine pigment) (the content ratio of the benzimidazolone pigment and the phthalocyanine pigment was 52.5:47.5, and the content of the pigment component was 35 parts by mass with respect to 100 parts by mass of the resin component) in the solvent.

[Dark Color Ink (Ink 2)]

Ink 2 was prepared in a similar manner to Ink 1, except that an organic pigment was adjusted as follows and the coating amount of the solid content was adjusted to 10 g/m² to 20 g/m² (thickness after curing: 10 μm to 20 μm). Pigment: 16.7% by mass of dioxazine compound (the content of the pigment component was 20 parts by mass with respect to 100 parts by mass of the resin component)

(Measurement of Spectral Transmission Rate)

For evaluating the reflectivity (transmittivity) of near infrared light of the infrared-light-transmitting dark color ink according to the present embodiment, transmittivity measurement samples were produced as Examples and Comparative Examples by the following method.

The following resin was used as a resin base material serving as a reflective layer. Reflective layer: White PET manufactured by TORAY INDUSTRIES, INC., 188 μm The following resin was used as a resin base material serving as a transparent adhesion layer. Transparent adhesion layer: polyethylene, 60 μm <Sample Production>

Example 1

Ink 1 was gravure coated on a sheet formed by the reflective layer (the coating amount is 5 g/m²), an adhesive layer having a thickness of 5 μm (dry state) was laminated thereon, then the transparent adhesion layer was laminated thereon, and the obtained product was subjected to thermal curing by performing an aging treatment at 45° C. to 55° C. for 168 hours, thereby producing an infrared-light-reflecting sheet.

Comparative Example 1

Ink 2 was gravure coated on a sheet formed by the reflective layer (the coating amount is 12 g/m²), an adhesive layer having a thickness of 12 μm (dry state) was laminated thereon, then the transparent adhesion layer was laminated thereon, and the obtained product was subjected to thermal curing by performing an aging treatment at 45° C. to 55° C. for 168 hours, thereby producing an infrared-light-reflecting sheet.

<Evaluation>

A reflection rate (%) of light having a wavelength of 300 nm to 1200 nm when light was incident to the infrared-light-reflecting sheet samples of Example 1 and Comparative Example 1 was evaluated by using a spectrophotometer ("U-4100" manufactured by Hitachi High-Technologies Corporation). Evaluation results are presented in FIG. 3.

Figure 3:
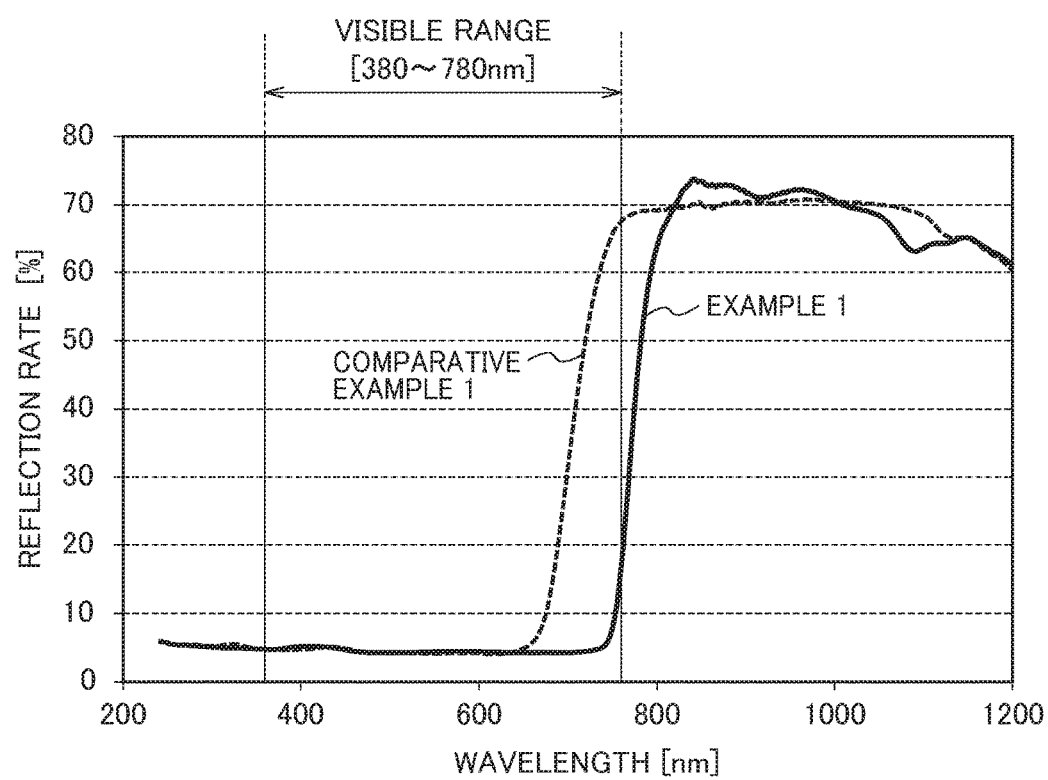
FIG. 3 is a graph showing infrared reflection rates of Example 1 and Comparative Example 1.

From FIG. 3, when the infrared-light-reflecting sheet of Example 1 is provided with the infrared-light-transmitting dark color layer 60 containing a predetermined amount of the brown pigment (benzimidazolone pigment) and the phthalocyanine pigment, an infrared light transmission rate is particularly improved near a wavelength of about 800 nm to 900 nm that has higher energy than a wavelength of 1000 nm or more. For this reason, it is found that as compared to the case of adding an organic black pigment of the related art, the infrared-light-transmitting dark color ink has a high transmission rate near a wavelength of about 800 nm to 900 nm.

Incidentally, a transmission rate measurement sample was produced by peeling off polyethylene and the white PET of the infrared-light-reflecting sheet of Example 1 and dissolving the infrared-light-transmitting dark color layer by using methyl ethyl ketone. The measurement sample was injected into a quartz glass cell, and a transmission rate (%) of light having a wavelength of 300 nm to 1200 nm was measured with a spectrophotometer (for example, an ultraviolet spectrophotometer "V-670" manufactured by JASCO Corporation or "U-4100" manufactured by Hitachi High-Technologies Corporation). As a result, the transmission rate of light having a wavelength of 425 nm was 11.6%, and the transmission rate of light having a wavelength of 675 nm was 10.0%.

The infrared-light-reflecting sheet of Example 1 approximately absorbs light in a visible range (wavelength: 380 nm to 780 nm); on the other hand, the infrared-light-reflecting sheet of Comparative Example 1 reflects light in a visible range near a wavelength of 700 nm to 750 nm. For this reason, the ink of Example 1 has black appearance and is excellent in terms of design attractiveness. However, since the ink of Comparative Example 1 transmits light in a visible range near a wavelength of 700 nm to 750 nm, it is found that the ink of Comparative Example 1 has an appearance of a dark color near violet rather than black and is an ink that is inferior in design attractiveness.

(Color Coordinate-Coating Amount Dependency Test 1)

<Sample Production>

Examples 2 to 4

Each infrared-light-reflecting sheet was produced by gravure coating Ink 1 on each infrared-light-reflecting sheet at each coating amount, similarly to Example 1. Thereafter, each infrared-light-reflecting sheet was used as the rear surface protective sheet to newly produce a pseudo module.

The pseudo module was produced by vacuum lamination in such a manner that glass as the transparent front substrate, an ethylene-vinyl acetate copolymer resin (EVA resin) of 450 μm as the sealing material layer, and the sample according to this Example as the infrared-light-reflecting sheet (rear surface protective sheet) were laminated in the following order: transparent front substrate/the front surface sealing material layer/the rear surface sealing material layer/the infrared-light-reflecting sheet (rear surface protective sheet).

(Vacuum Lamination Conditions: Temperature of 150° C., Vacuum Time of 5 Minutes, Pressing Time of 9 Minutes)

Comparative Examples 2 to 6

Each infrared-light-reflecting sheet was produced by gravure coating dark color Ink 2 at each coating amount instead of dark color Ink 1 in Examples 2 to 4. Thereafter, each infrared-light-reflecting sheet was used as the rear surface protective sheet to newly produce a pseudo module, similarly to Examples 2 to 4.

<Evaluation>

Measurement was carried out by irradiating each sample with a light source from the transparent resin layer side using a spectrophotometer Cry 700d manufactured by KONICA MINOLTA, INC. according to JIS Z8722 under the conditions of a D65 light source and a 10° view angle. The results of color coordinates obtained by this test are presented in Table 1 and FIGS. 4 and 5.

TABLE 1

| | Ink | Coating amount | a* | b* | L* |
|---|---|---|---|---|---|
| Example 2 | Ink 1 | 5 g/m² | 2.06 | −2.67 | 8.14 |
| Example 3 | Ink 1 | 7 g/m² | 2.08 | −2.31 | — |
| Example 4 | Ink 1 | 10 g/m² | 2.05 | −1.84 | — |
| Comparative Example 2 | Ink 2 | 10 g/m² | 5.9 | −6.3 | — |

TABLE 1-continued

|  | Ink | Coating amount | a* | b* | L* |
|---|---|---|---|---|---|
| Comparative Example 3 | Ink 2 | 13 g/m² | 3.8 | −3.2 | — |
| Comparative Example 4 | Ink 2 | 15 g/m² | 3.3 | −2.6 | 8.30 |
| Comparative Example 5 | Ink 2 | 18 g/m² | 2.5 | −1.2 | — |
| Comparative Example 6 | Ink 2 | 20 g/m² | 1.8 | −0.5 | — |
| Carbon black |  | 5 g/m² | 0.15 | −0.48 | 5.70 |

Figure 4:
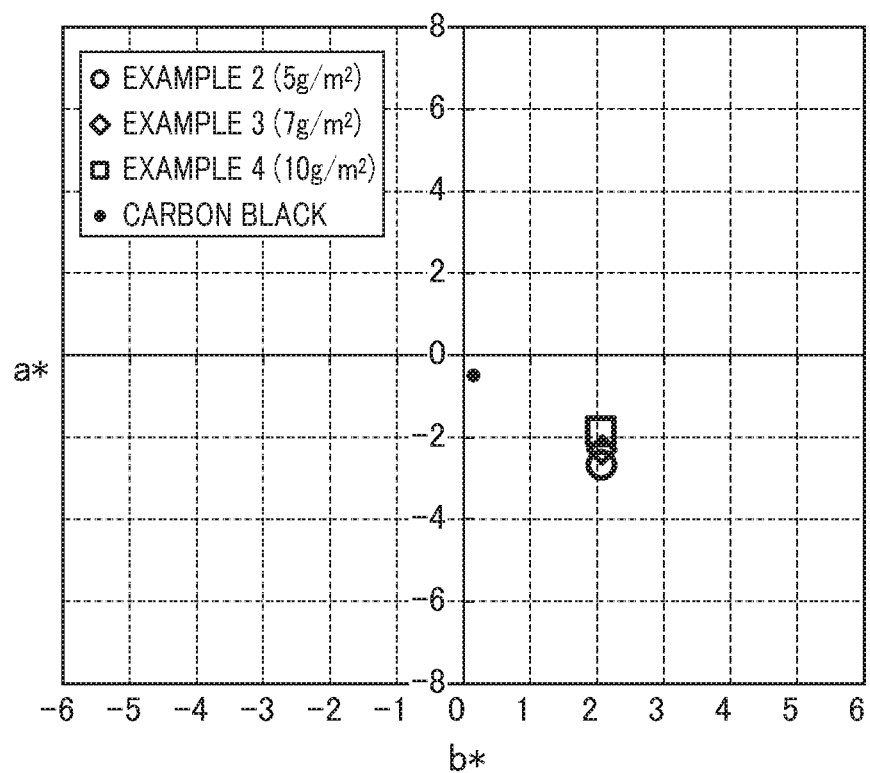
FIG. 4 is a diagram illustrating color coordinates of Examples 2 to 4.

From Table 1 and FIGS. 4 and. 5, the samples of Comparative Examples having a coating amount of 10 to 20 g/m² have large fluctuation in a* and b*; on the other hand, the samples of Examples have small fluctuation in color tone for each coating amount. From Table 1, the value of L* of Comparative Example 4 having a coating amount of 15 g/m² is approximately equal to the value of L* of Example 2 having a coating amount of 5 g/m². From this result, the infrared-light-transmitting dark color inks of Examples have a color tone close to that of carbon black, and fluctuation in color coordinate with respect to the coating amount of solid contents in the adhesive is small. For this reason, it is found that the infrared-light-transmitting dark color inks of Examples are an infrared-light-transmitting dark color ink with a high yield and high productivity. It is found that as compared to the samples of Comparative Examples, the infrared-light-transmitting dark color inks of Examples are an infrared-light-transmitting dark color ink which can exhibit sufficient design attractiveness even with a small coating amount.

(Color Coordinate-Coating Amount Dependency Test 2)

A pseudo module was produced as the color coordinate-coating amount dependency test 1 described above by adjusting the blending ratio (the mass ratio) of the ink in which the content ratio of the brown pigment (benzimidazolone pigment (in Table 2, described as brown)) and the phthalocyanine pigment (in Table 2, described as blue) of Ink 1 was changed as presented in Table 2 to have a coating amount of 5 g/m². Then, measurement was carried out by irradiating each sample with a light source from the transparent resin layer side using a spectrophotometer CM-700d manufactured by KONICA MINOLTA, INC. according to JIS Z8722 under the conditions of a D65 light source and a 10° view angle. From the measurement result, color differences (ΔE*ab) with carbon black were obtained respectively. The measurement result of the color coordinate and color differences (ΔE*ab) with carbon black obtained by this test are presented in Table 2. Incidentally, the description "Content of brown pigment" in Table 2 means the content of the brown pigment with respect to 100 parts by mass of the phthalocyanine pigment.

The transmission rates (%) of light having a wavelength of 425 nm and light having a wavelength of 675 nm of each ink of Examples 5 to 9, 16, and 17 and Comparative Examples 11 and 12 in Table 2 were obtained respectively. Specifically, 5 g/m² of each ink of Examples 5 to 9 and Test Examples 1 to 4 was gravure coated on a fluorine film (fluorine film AFLEX manufactured by ASAHI GLASS CO., LTD., 100 μm) serving as a transparent base material, the same transparent base material was laminated thereon, and the obtained product was subjected to dry lamination and then subjected to thermal curing by performing an aging treatment at 45° C. to 55° C. for 168 hours, thereby producing a transmission rate measurement sample. Then, the transmission rate of light having a wavelength of 425 nm and the transmission rate of light having a wavelength of 675 nm were obtained respectively from the transmission rate (%) of light having a wavelength of 300 nm to 1200 nm by using a spectrophotometer ("U-4100" manufactured by Hitachi High-Technologies Corporation).

TABLE 2

|  | Brown | Blue Content of brown pigment | a* | b* | L* | Color difference (ΔE*ab) | Transmission rate of light having wavelength of 425 nm | Transmission rate of light having wavelength of 675 nm |
|---|---|---|---|---|---|---|---|---|
| Comparative Example 11 | 100 | 0 — | 35.14 | 28.30 | 20.98 | 47.81 | 2.5 | 73.0 |
| Example 6 | 80 | 20 400 parts by mass | 10.75 | 7.20 | 9.63 | 13.67 | 7.6 | 32.5 |
| Example 5 | 70 | 30 233 parts by mass | 5.18 | 4.66 | 6.76 | 7.27 | 9.3 | 19.9 |
| Example 6 | 60 | 40 150 parts by mass | 3.28 | 1.35 | 5.91 | 3.63 | 11.0 | 13.1 |
| Example 7 | 50 | 50 100 parts by mass | 2.63 | −0.80 | 6.42 | 2.60 | 13.3 | 8.7 |
| Example 8 | 40 | 60 66 parts by mass | 2.67 | −5.24 | 7.43 | 5.66 | 16.4 | 6.0 |
| Example 9 | 30 | 70 43 parts by mass | 1.72 | −8.25 | 9.16 | 8.65 | 22.1 | 4.4 |
| Example 17 | 20 | 80 25 parts by mass | 0.41 | −10.29 | 10.04 | 10.73 | 26.9 | 3.7 |
| Comparative Example 12 | 0 | 100 0 parts by mass | −20.63 | −34.04 | 28.60 | 45.63 | 48.4 | 3.6 |

TABLE 2-continued

|  | Content of brown pigment | Brown pigment | Blue pigment | a* | b* | L* | Color difference (ΔE*ab) | Transmission rate of light having wavelength of 425 nm | Transmission rate of light having wavelength of 675 nm |
|---|---|---|---|---|---|---|---|---|---|
| Carbon black | — | | — | 0.15 | −0.48 | 5.70 | — | — | — |

From this test result, the infrared-light-transmitting dark color ink in which the content of the brown pigment is 43 parts by mass to 233 parts by mass with respect to 100 parts by mass of the phthalocyanine pigment (the content ratio of the brown pigment and the phthalocyanine pigment is in a range of 30:70 to 70:30 in terms of mass ratio) and preferably 66 parts by mass to 150 parts by mass (the content ratio of the brown pigment and the phthalocyanine pigment is 40:60 to 60:10 in terms of mass ratio) has a smaller color difference (ΔE*ab) to carbon black than the infrared-light-transmitting dark color ink in which the content of the brown pigment is out of the range. For this reason, it is found that the infrared-light-transmitting dark color inks of Examples 5 to 9 are closer to the color tone of carbon black than the inks of Examples 16 and 17 and Comparative Examples 11 and 12, and thus are an infrared-light-transmitting dark color ink which can exhibit sufficient design attractiveness.

(High-Temperature Discoloration Test)
<Sample Production>

Example 10

An infrared-light-reflecting sheet was produced by gravure coating ink 1 at a coating amount of 7 g/m², similarly to Example 1. Thereafter, each infrared-light-reflecting sheet was used as the rear surface protective sheet to newly produce a pseudo module, similarly to Examples 2 to 4.

Comparative Example 12

A sample was produced by gravure coating Ink 2 at a coating amount of 7 g/m², similarly to Ink 1. Thereafter, pseudo modules were produced from each sheet sample, similarly to Examples 2 to 4.
<Evaluation>

The sample was stored at 170° C. for 14 hours, and the color tone after storage was measured. The color tone was obtained by measuring the color coordinate of each sample of Examples and Comparative Examples according to JIS X8722 under the conditions of a D65 light source and a 10 view angle. Measurement was carried out on each sample by using a spectrophotometer CM-700d manufactured by KONICA. MINOLTA, INC.

The color one changes of Examples and Comparative Examples before and after storage were measured three times, respectively. The change amounts of average values thereof are presented in Table 3.

TABLE 3

|  | ΔL* | Δa* | Δb* | Color difference (ΔE*ab) |
|---|---|---|---|---|
| Example 10 | 0.47 | −0.78 | −0.79 | 1.20 |
| Comparative Example 7 | −1.84 | 11.53 | 2.70 | 11.98 |

From Table 3, the color difference of the sample of Example 10 is smaller than that of the sample of Comparative Example 7. From this point, other layers of the laminate produced by using the infrared-light-transmitting dark color ink of the present embodiment are not discolored even when exposed to a harsh environment of 170° C. Therefore, it is found that the laminate obtained by laminating the infrared-light-transmitting dark color ink of the present embodiment is an excellent laminate that has no change in design attractiveness even in a high-temperature environment. In particular, when the infrared-light-reflecting sheet of the present embodiment is used as the rear surface protective sheet for the solar cell module, the discoloration of the sealing layer caused by transition of the dark color pigment contained in the infrared-light-transmitting dark color layer 60 of the rear surface protective sheet to the sealing layer does not occur. Therefore, it is found that a solar cell module can be produced which has no decrease in electric power generation efficiency caused by the discoloration of the sealing layer and is excellent in terms of storage stability.

(Interlayer Strength-Durability Test)
<Sample Production>

Adhesiveness measurement samples of Example 11 and Reference Example were produced respectively by performing attachment using Ink 1 and Ink 2. Regarding the sample production, an infrared-light-reflecting sheet of Example 11 was produced by gravure coating Ink 1 in a similar manner to Example 1 (the coating amount of Ink 1 is 5 g/m², and the thickness is 5 μm (dry state)). An infrared-light-reflecting sheet of Reference Example was produced by gravure coating Ink 2 in a similar manner to Comparative Example I (the coating amount of Ink 2 is 10 g/m², and the thickness is 10 μm (dry state)).

A test related to adhesiveness was performed on the samples of Example 11 and Reference Example with the following method, and the adhesiveness was evaluated on the basis of the measurement results. All test pieces have a width of 15 mm.

(Adhesiveness Test) A peeling strength (N) of each sample of Example 11 and Reference Example was obtained in a 180 degree peeling test method according to JIS K6854-2 by measuring an initial value and a value after each durability test described below. In each sample measurement, a peeling tester (product name "TENSILON RTA-1150-H" manufactured by A&D Company, Limited) was used and measurement was performed in peeling conditions of 50 mm/min and. 23° C.

(Wet Heat Durability (PCT) Test)
The conditions in a pressure cooker tester (HASTTEST manufactured by HIRAYAMA MANUFACTURING CORPORATION) were set to 120° C., 85% RH, and 1.6 atm, and the above respective samples were input thereto for a certain time (in Table 4, "before input" is described as 0 h, and "after input for 24 hours" is described as 24 h and the like). Thereafter, the peeling test was performed three times. An average value of each measurement result before input and after input for a certain time is presented in Table 4.

TABLE 4

| | Ink type | 0 h | 24 h | 48 h [N/15 mm] | 72 h |
|---|---|---|---|---|---|
| Reference Example | Ink 2 | 7.0 | 6.8 | 6.5 | 6.1 |
| Example 11 | Ink 1 | 7.1 | 6.5 | 5.3 | 5.2 |

From Table 4, it is found that the infrared-light-transmitting dark color ink according to Example 11 has the same adhesiveness and approximately the same adhesiveness durability as those of the dark color ink according to Reference Example containing a dioxazine compound having high adhesiveness durability.

From the above result, it is found that the infrared-light-transmitting dark color ink of the present embodiment is an infrared-light-transmitting dark color ink which has higher infrared-light-transmitting property, favorable design attractiveness even with an extremely small coating amount, a favorable yield, and extremely high productivity while having the same adhesiveness and approximately the same adhesiveness durability as those of the dark color ink containing a dioxazine compound.

For this reason, for example, the rear surface protective sheet for the solar cell module which uses the infrared-light-reflecting sheet produced by the infrared-light-transmitting dark color ink according to the present invention can further suppress heat generation by absorbing infrared light owing to the high infrared-light-transmitting property thereof and can use a larger quantity of near infrared light in electric power generation. Therefore, the solar cell module using the infrared-light-transmitting dark color ink according to the present embodiment is an extremely excellent solar cell module which can further improve the electric power generation efficiency of the solar cell module as compared to the related art.

Examples in Other Embodiments

For evaluating adhesiveness, adhesiveness durability, blocking resistance, adhesion, and color coordinate coating amount dependency of the rear surface protective sheet according to the present embodiment, an adhesive was produced with the following method and an adhesiveness measurement sample using the adhesive was produced.
[Production of Infrared-Light-Transmitting Dark Color Ink (Ink 3)]
[Main Agent]
Aliphatic polycarbonate diol (50 parts by mass) having a number average molecular weight of 1000, 1,6-hexanediol (70 parts by mass), 1,8-octanediol (30 parts by mass), isophorone diisocyanate (IPDI) (176.6 parts by mass), trimethylolpropane (TMP) adduct-modified product (10 parts by mass) of isophorone diisocyanate (IPDI), and ethyl acetate (333.6 parts by mass) were filled into a round-bottomed flask equipped with a stirrer, a thermometer, and a nitrogen gas introducing tube, and the resultant mixture was heated to reflux under the introduction of nitrogen gas until isocyanate absorption at 2270 $cm^{-1}$ disappeared in the infrared absorption spectrum, thereby preparing a main agent resin of Example 1 having a glycol modification amount of 10% and a IPDI modification amount of 2%. Incidentally, in this Example, the glycol modification amount indicates the mass (mass ratio %) of an alkylene diol compound (in this Example, a mixture of 1,6-hexanediol and 1,8-octanediol) with respect to the total component mass of the main agent resin component, and the IPDI modification amount indicates the Mass (mass ratio %) of a modified isocyanate compound (in this Example, a trimethylolpropane (TMP) adduct-modified product of isophorone diisocyanate (IPDI)) with respect to the total component mass of the main agent resin component.

The total added amount of 1,6-hexanediol and 1,8-octanediol and the added amount of the trimethylolpropane (TMP) adduct-modified product of isophorone diisocyanate (IPDI) were appropriately adjusted so that the glycol modification amount became 10% and the IPDI modification amount became 3%.
[Curing Agent]
A curing agent consisting of a nurate product (40 parts by mass) of hexamethylene diisocyanate (HDI) and a trimethylolpropane (TMP) adduct-modified product (60 parts by mass) of isophorone diisocyanate (IPDI) was prepared. Each blending was carried out so that each NCO/OH ratio that is a ratio of the NCO value of the polyisocyanate compound to the OH value of the cross-linking main agent resin is as presented in Table 5. Pigment: brown pigment (benzimidazolone pigment (Pigment Brown 25, particle diameter: 0.08 µm)), phthalocyanine pigment (amorphous phthalocyanine blue pigment (Pigment Blue 15, particle diameter: 0.15 to 0.20 µm))
Solvent: ethyl acetate The main agent, the curing agent, the brown pigment (benzimidazolone pigment), and the phthalocyanine pigment (the content ratio of the brown pigment and the phthalocyanine pigment is 52.5:47.5, the content of the pigment component is 40 parts by mass with respect to 100 parts by mass of the main agent resin component) were dissolved in the solvent to obtain Ink 3.
Production of Transparent Adhesive]
[Main Agent]
[Ethylene glycol (32.3 parts by mass), 2,2-dimethyl-1,3-propanediol (270.8 parts by mass), 1,6-hexanediol (122.9 parts by mass), adipic acid (228.1 parts by mass), and isophthalic acid (664 parts by mass) were added to a flask equipped with a stirrer and a nitrogen introducing tube in a nitrogen atmosphere, the resultant mixture was subjected to nitrogen bubbling at 180° C. to 220° C. and reacted until an acid value reached 2 mgKOH/g, and then ethyl acetate (860 parts by mass) was added thereto, thereby obtaining a 50% polyester diol H solution. The OH value of the obtained resin was 32 mgKOH/g and the number average molecular weight thereof was about 3500.

100 parts by mass of aliphatic polycarbonate diol having a number average molecular weight of 1000 (product name "DURANOL T5651" manufactured by Asahi Kasei Chemicals Corporation, hereinafter, abbreviated as "PDC 1000"), and polyester diol H (50 parts by mass), 1,6-hexanediol (2 parts by mass), isophorone diisocyanate (23.8 part, by mass), ethyl acetate (175.8 parts by mass) which are described above were added to a flask equipped with a stirrer in a nitrogen atmosphere, and the resultant mixture was heated to reflux until isocyanate absorption at 2270 $cm^{-1}$ disappeared in the infrared absorption spectrum, thereby obtaining a 50% polyurethane diol solution. The OH value of the obtained resin was 14 mgKOH/g and the number average molecular weight thereof was about 8000.

A main agent was prepared by mixing 100 parts by mass of the polyurethane diol and 15 parts by mass of the aliphatic polycarbonate diol (B) (PDC 1000). Incidentally, the same curing agent as that in Ink 3 was used. Solvent: ethyl acetate the main agent (solid content proportion: 50% by mass), the curing agent (solid content proportion: 10% by mass), and 16.7% by mass of the dioxazine compound (the content of the pigment component is 20 parts by mass with respect to 100 parts by mass of the main agent resin component)

The main agent of the transparent adhesive, the curing agent of the transparent adhesive, and the solvent were prepared at a mass ratio of 18:3.4:5.4.

(Blocking Resistance Test)

A test related to blocking resistance was performed on the samples of Examples 12 to 15 and Comparative Examples 8 to 10 with the following method, and the blocking resistance was evaluated on the basis of the measurement results. All test pieces have a width of 15 mm.

An infrared-light-transmitting dark color ink solution was applied onto the surface of a white PET (White PET manufactured by TORAY INDUSTRIES, INC., 188 μm) film with a bar coater, and the applied ink solution was dried at 120° C. for 2 minutes to form a dark color ink layer on the base material surface. Then, white PET (White PET manufactured by TORAY INDUSTRIES, INC., 188 μm) was laminated on the surface of the dark color ink layer immediately after drying to be brought into contact with each other, and the obtained product after curing at 50° C. for 3 days in this state was used as a blocking resistance evaluation sample. A blocking resistance test was performed according to a method of evaluating the blocking state by peeling off a portion in which respective blocking resistance evaluation samples are laminated, and the evaluation was performed on the basis of the following criteria. The evaluation results are presented in Table 5. Incidentally, the NCO/OH ratio in Table 5 is a ratio of the NCO value of the curing agent to the OH value of the main agent resin.

[Evaluation Criteria]

A: The dark color ink layer is not transferred, and sheets are naturally peeled off.

B: The dark color ink layer is not transferred, and there is slight sticky feeling at the time of peeling off sheets.

C: The dark color ink layer is transferred, and/or there is sticky feeling at the time of peeling off sheets.

(Adhesion Test)

A test related to blocking resistance was performed on the samples of Examples 12 to 15 and Comparative Examples 8 to 10 with the following method, and the Adhesion was evaluated on the basis of the measurement results. All test pieces have a width of 15 mm.

An adhesion test according to ASTM D3359 and JIS 5400 was performed and the adhesion was evaluated on the basis of the following criteria. The results are presented as "Adhesion" in the following Table 5.

[Evaluation Criteria]

A: 0% of coating peeling

B: more than 0% and 15% or less of coating peeling

C: more than 15% of coating peeling

TABLE 5

| | NCO/OH ratio | Coating amount | Blocking resistance | Adhesion |
|---|---|---|---|---|
| Comparative Example 12 | 1.0 | 4 g/m² | A | A |
| Comparative Example 8 | 3.0 | 4 g/m² | C | A |
| Comparative Example 9 | 6.0 | 4 g/m² | C | A |
| Comparative Example 10 | 0.5 | 4 g/m² | A | C |

TABLE 5-continued

| | NCO/OH ratio | Coating amount | Blocking resistance | Adhesion |
|---|---|---|---|---|
| Example 13 | 2.0 | 3 g/m² | A | A |
| Example 14 | 2.0 | 5 g/m² | A | A |
| Example 15 | 2.0 | 7 g/m² | B | A |

From Table 5, the sample of the present embodiment in which the NCO/OH ratio of the infrared-light-transmitting dark color ink is set to 1.0 to 2.0 has high blocking resistance and adhesion. For this reason, since the infrared-light-transmitting dark color ink used in the present invention has favorable blocking resistance and adhesion, it is found that the infrared-light-transmitting dark color ink is preferable in production of the rear surface protective sheet of a solar cell module of the present invention.

(Color Coordinate-Coating Amount Dependency Test)

<Sample Production>

Examples 13 to 15

The infrared-light-transmitting dark color ink solution was applied on the surface of a white PET (White PET manufactured by TORAY INDUSTRIES, INC., thickness: 188 μm) film with a bar coater (the coating amount is described in Table 6), and the applied ink solution was dried at 120° C. for 2 minutes to form a dark color ink layer on the base material surface. Then, the transparent adhesive was gravure coated on the surface of the dark color ink layer immediately after drying (the coating amount is 5.0 g/m²), the adhesive layer having a thickness of 5.0 μm (dry state) was laminated thereon, a polyethylene resin (thickness: 60 μm) was laminated thereon, the obtained product was subjected to thermal curing by performing an aging treatment at 45° C. to 55° C. for 168 hours to produce a rear surface protective sheet, and then a pseudo module was newly produced from the rear surface protective sheet.

The pseudo module was produced by vacuum lamination in such a manner that glass as the transparent front substrate, an ethylene-vinyl acetate copolymer resin (EVA resin) of 450 μm as the sealing material layer, and the sample according to this Example as the rear surface protective sheet were laminated in the following order: the transparent front substrate/the front surface sealing material layer/the rear surface sealing material layer/the rear surface protective sheet.

(Vacuum Lamination Conditions: Temperature of 150° C., Vacuum Time of 5 Minutes, Pressing Time of 9 Minutes)

<Evaluation>

Measurement was carried out by irradiating each sample with a light source from the transparent resin layer side using a spectrophotometer CM-700d manufactured by KONICA MINOLTA, INC. according to JIS Z8722 under the conditions of a D65 light source and a 10' view angle. The results of color coordinates obtained with this test are presented in Table 6.

TABLE 6

| | Ink | Coating amount | a* | b* | L* |
|---|---|---|---|---|---|
| Example 13 | Ink 3 | 3 g/m² | 1.92 | −1.41 | 5.76 |
| Example 14 | Ink 3 | 5 g/m² | 1.77 | −1.28 | 5.88 |
| Example 15 | Ink 3 | 7 g/m² | 1.57 | −1.06 | 5.53 |
| Comparative Example 3 | Ink 2 | 10 g/m² | 5.9 | −6.3 | — |

TABLE 6-continued

| | Ink | Coating amount | a* | b* | L* |
|---|---|---|---|---|---|
| Comparative Example 4 | Ink 2 | 13 g/m² | 3.8 | −3.2 | — |
| Comparative Example 5 | Ink 2 | 15 g/m² | 3.3 | −2.6 | 8.30 |
| Comparative Example 6 | Ink 2 | 18 g/m² | 2.5 | −1.2 | — |
| Comparative Example 7 | Ink 2 | 20 g/m² | 1.8 | −0.5 | — |
| Carbon black | | 5 g/m² | 0.15 | −0.48 | 5.70 |

Figure 5:
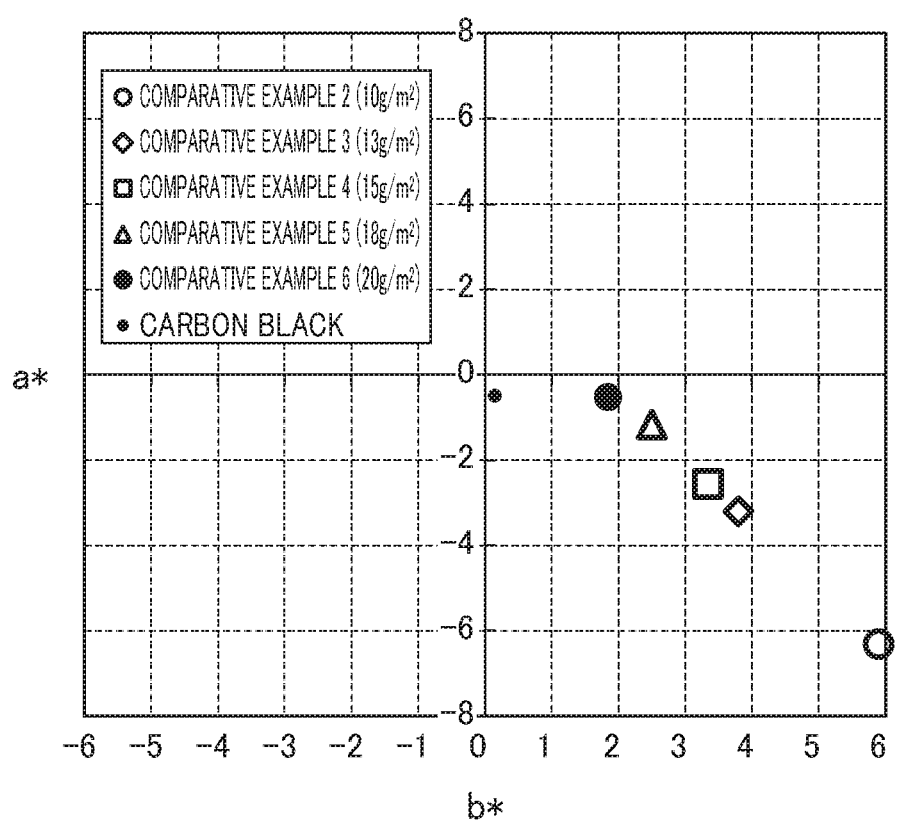
FIG. 5 is a diagram illustrating color coordinates of Comparative Examples 2 to 6.
Figure 7:
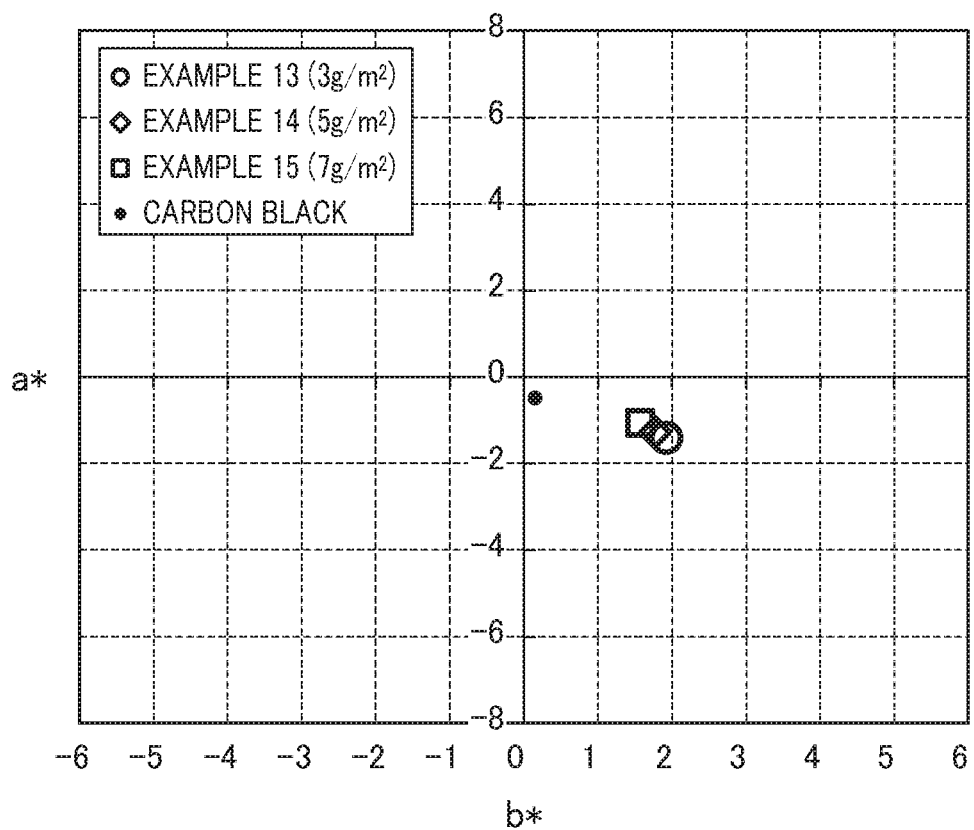
FIG. 7 is a diagram illustrating color coordinates of Examples 13 to 15.

From Table 6 and FIGS. 5 and 7, a* and b* in the samples of Comparative Examples largely fluctuate according to a change in coating amount of the adhesive (ink); on the other hand, fluctuation of a* and b* in the samples of Example according to the change in coating amount of the adhesive (ink) is small. From this result, it as found that the infrared-light-transmitting dark color inks of Examples have small dependency on the color coordinate with respect to the coating amount of solid contents in the adhesive (ink). L* of the samples of Examples is smaller than that of the sample of Comparative Example 5 in which the coating amount of the adhesive (ink) is larger than those in Examples, and is equal to L* of carbon black. From this test result, it is found that even when the infrared-light-transmitting dark color layer, which is formed by the infrared-light-transmitting dark color ink that contains the brown pigment and the pigment component containing a phthalocyanine pigment component, has a small thickness, the infrared-light-transmitting dark color layer has sufficient design attractiveness. For this reason, for example, when the infrared-light-transmitting dark color layers are intended to be laminated for partially coloring the transparent adhesion layer and/or the reflective layer from the viewpoint of design attractiveness, the use amount of the transparent adhesive can be decreased. Therefore, it is found that the infrared-light-reflecting sheet of the present invention is an excellent infrared-light-reflecting sheet which can reduce costs and improve productivity.

(Adhesion Test)

<Sample Production>

An infrared-light-transmitting dark color ink solution was applied on the surface of a white PET (White PET manufactured by TORAY INDUSTRIES, INC., 188 μm) film with a bar coater (the coating amount is 4 g/m²), and the applied ink solution was dried at 120° C. for 2 minutes to form an infrared-light-transmitting dark color layer on the base material surface. Then, the transparent adhesive was gravure coated on the surface of the infrared-light-transmitting dark color layer (the coating amount is 5.0 g/m²), a transparent adhesive layer having a thickness of 5.0 μm (dry state) was laminated thereon, a polyethylene resin (60 μm) was laminated thereon, and the obtained product was subjected to dry lamination and then subjected to thermal curing by performing an aging treatment at 45° C. to 55° C. for 168 hours, thereby producing an infrared-light-reflecting sheet sample. The conditions in a pressure cooker tester (HASTIEST manufactured by HIRAYAMA MANUFACTURING CORPORATION) were set to 120° C., 85% RH, and 1.6 atm, the above respective samples were input thereto for a certain time (in Table 7, "before input" is described as 0 h, and "after input for 24 hours" is described as 24 h and the like). Thereafter, the peeling test was performed three times. An average value of each measurement result before input and after input for a certain time is presented in Table 7. Incidentally, the NCO/OH ratio in Table 7 is a ratio of the NCO value of the curing agent to the OH value of the main agent resin.

TABLE 7

| | NCO/OH ratio | 0 h | 24 h [N/15 mm] | 48 h | 72 h |
|---|---|---|---|---|---|
| Comparative Example 10 | 0.5 | 9.5 | 7.8 | 5.2 | 3.6 |
| Example 12 | 1.0 | 10.4 | 11.6 | 12.5 | 9.1 |

From Table 7, it is found that the sample of Example 12 in which the NCO/OH ratio is 1.0 to 2.0 is a sample having higher adhesiveness and higher adhesiveness durability than Comparative Example 10.

EXPLANATION OF REFERENCE NUMERALS

1 SOLAR CELL MODULE
2 TRANSPARENT FRONT SUBSTRATE
3 FRONT SURFACE SEALING MATERIAL LAYER
4 SOLAR CELL ELEMENT
5 REAR SURFACE SEALING MATERIAL LAYER
6 INFRARED-LIGHT-REFLECTING SHEET (REAR SURFACE PROTECTIVE SHEET)
7 INCIDENT LIGHT
60 INFRARED-LIGHT-TRANSMITTING DARK COLOR LAYER
61 REFLECTIVE LAYER
62 TRANSPARENT ADHESION LAYER
63 TRANSPARENT ADHESIVE LAYER

The invention claimed is:

1. An infrared-light-reflecting sheet comprising an infrared-light-transmitting dark color layer and a reflective layer,
   wherein the infrared-light-transmitting dark color layer contains a first pigment and a second pigment,
   the first pigment is at least one or more pigments selected from the group consisting of a benzimidazolone pigment, 4-[(2,5-dichlorophenyl)azo]-3-hydroxy-N-(2,5-dimethoxyphenyl)-2-naphthalenecarboxamide, 1-[(4-nitrophenyl)azo]-2-naphthalenol, bis[3-hydroxy-4-(phenylazo)-2-naphthalenecarboxylic acid]copper salt, C. I. Pigment Brown 7, N,N'-bis(2,4-dinitrophenyl)-3,3'-dimethoxy-1,1'-biphenyl-4,4'-diamine, 3,4,9,10-perylenetetracarboxylic diimide, Δ2,2'(1H,1'H)-bi-naphtho[2,1-b]thiophen-1,1'-dione, and N,N'-(10,15,16,17-tetrahydro-5,10,15,17-tetraoxo)-5H-dinaphtho[2,3-a:2',3'-i]carbazole-4,9-diyl)bis(benzamide), and
   the second pigment contains a phthalocyanine pigment,
   wherein a light reflection rate of the infrared-light-reflecting sheet is less than 15% when light having a wavelength of 700 nm to 750 nm is incident to the infrared-light-reflecting sheet.

2. The infrared-light-reflecting sheet according to claim 1, further comprising a transparent easy-adhesive layer laminated on the surface on the lamination side of the infrared-light-transmitting dark color layer of the infrared-light-reflecting sheet.

3. The infrared-light-reflecting sheet according to claim 1, wherein the infrared-light-transmitting dark color layer contains a main agent resin having a hydroxyl group, and a pigment component, a content of the pigment component is 20 parts by mass to 40 parts by mass with respect to 100 parts by mass of a resin component,
   the pigment component contains a first pigment and a second pigment.

4. The infrared-light-reflecting sheet according to claim 3, wherein a coating amount of an infrared-light-transmitting dark color ink forming the infrared-light-transmitting dark color layer in terms of solid content is 5 g/m² to 15 g/m².

5. The infrared-light-reflecting sheet according to claim 1, wherein a color difference ΔE*ab between a color tone of the infrared-light-transmitting dark color layer and a color tone of carbon black as measured under conditions of a D65 light source and a 10° view angle according to JIS-Z 8722 is 10 or less.

6. The infrared-light-reflecting sheet according to claim 1,
wherein an infrared-light-transmitting coat layer is laminated on a surface opposite to the lamination surface of the infrared-light-transmitting dark color layer of the reflective layer, and
the infrared-light-transmitting coat layer is a layer containing an organic dark color pigment and transmitting near infrared light having a wavelength of 750 nm to 1500 nm.

7. A solar cell module comprising the infrared-light-reflecting sheet according to claim 1 and a solar cell element,
wherein the infrared-light-reflecting sheet is disposed on a non-photoreception surface side of the solar cell element.

8. The infrared-light-reflecting sheet according to claim 3, wherein a color difference ΔE*ab between a color tone of the infrared-light-transmitting dark color layer and a color tone of carbon black as measured under conditions of a D65 light source and a 10° view angle according to JIS-Z 8722 is 10 or less.

9. The infrared-light-reflecting sheet according to claim 3,
wherein an infrared-light-transmitting coat layer is laminated on a surface opposite to the lamination surface of the infrared-light-transmitting dark color layer of the reflective layer, and
the infrared-light-transmitting coat layer is a layer containing an organic dark color pigment and transmitting near infrared light having a wavelength of 750 nm to 1500 nm.

10. An infrared-light-reflecting sheet obtained by laminating a plurality of layers, the plurality of layers including at least:
a transparent adhesion layer transmitting light beams; and
a reflective layer reflecting light,
wherein two layers among layers laminated between the transparent adhesion layer and the reflective layer are an infrared-light-transmitting dark color layer and a transparent adhesive layer,
the infrared-light-transmitting dark color layer contains a first pigment and a second pigment,
the first pigment is at least one or more pigments selected from the group consisting of a benzimidazolone pigment, 4-[(2,5-dichlorophenyl)azo]-3-hydroxy-N-(2,5-dimethoxyphenyl)-2-naphthalenecarboxamide, 1-[(4-nitrophenyl)azo]-2-naphthalenol, bis[3-hydroxy-4-(phenylazo)-2-naphthalenecarboxylic acid]copper salt, C. I. Pigment Brown 7, N,N'-bis(2,4-dinitrophenyl)-3,3'-dimethoxy-1,1'-biphenyl-4,4'-diamine, 3,4,9,10-perylenetetracarboxylic diimide, Δ2,2'(1H,1'H)-bi-naphtho[2,1-b]thiophen-1,1'-dione, and N,N'-(10,15,16,17-tetrahydro-5,10,15,17-tetraoxo)-5H-dinaphtho[2,3-a:2',3'-i]carbazole-4,9-diyl)bis(benzamide), and
the second pigment contains a phthalocyanine pigment,
wherein a light reflection rate of the infrared-light-reflecting sheet is less than 15% when light having a wavelength of 700 nm to 750 nm is incident to the infrared-light-reflecting sheet.

11. The infrared-light-reflecting sheet according to claim 10, wherein a coating amount of an infrared-light-transmitting dark color ink forming the infrared-light-transmitting dark color layer in terms of solid content is 3 g/m$^2$ to 7 g/m$^2$.

12. The infrared-light-reflecting sheet according to claim 10, wherein the infrared-light-transmitting dark color layer contains a curing agent having an isocyanate group, and wherein the curing agent is a diisocyanate compound.

13. The infrared-light-reflecting sheet according claim 10, wherein the infrared-light-transmitting dark color layer is laminated only on a part of the surface of the transparent adhesion layer and/or the reflective layer.

14. The infrared-light-reflecting sheet according claim 11, wherein the infrared-light-transmitting dark color layer is laminated only on a part of the surface of the transparent adhesion layer and/or the reflective layer.

15. The infrared-light-reflecting sheet according to claim 10,
wherein an infrared-light-transmitting coat layer is laminated on a surface opposite to the lamination surface of the infrared-light-transmitting dark color layer of the reflective layer, and
the infrared-light-transmitting coat layer is a layer containing an organic dark color pigment and transmitting near infrared light having a wavelength of 750 nm to 1500 nm.

16. A solar cell module comprising the infrared-light-reflecting sheet according to claim 10 and a solar cell element,
wherein the infrared-light-reflecting sheet is disposed on a non-photoreception surface side of the solar cell element.

17. The infrared-light-reflecting sheet according to claim 10, wherein the infrared-light-transmitting dark color layer contains a main agent resin having a hydroxyl group and a pigment component,
the content of the pigment component is 20 parts by mass to 50 parts by mass with respect to 100 parts by mass of the main agent resin,
the pigment component contains a first pigment and a second pigment,
wherein an NCO/OH ratio that is a ratio of an NCO value of the curing agent to an OH value of the main agent resin is 1.0 to 2.0.

* * * * *